US007310789B2

(12) United States Patent
Seligson et al.

(10) Patent No.: US 7,310,789 B2
(45) Date of Patent: Dec. 18, 2007

(54) USE OF OVERLAY DIAGNOSTICS FOR ENHANCED AUTOMATIC PROCESS CONTROL

(75) Inventors: Joel L. Seligson, Misgav (IL); Mark Ghinovker, Migsdale Ha'Emek (IL); John Robinson, Austin, TX (US); Pavel Izikson, Haifa (IL); Michael E. Adel, Zichron (IL); Boris Simkin, Haifa (IL); David Tulipman, Haifa (IL); Vladimir Levinski, Nazareth Ilit (IL)

(73) Assignee: KLA-Tencor Technologies Corporation, Milpitas, CA (US)

( * ) Notice: Subject to any disclaimer, the term of this patent is extended or adjusted under 35 U.S.C. 154(b) by 0 days.

(21) Appl. No.: 11/510,147

(22) Filed: Aug. 24, 2006

(65) Prior Publication Data

US 2006/0280357 A1 Dec. 14, 2006

Related U.S. Application Data

(63) Continuation of application No. 10/438,963, filed on May 14, 2003, now Pat. No. 7,111,256.

(60) Provisional application No. 60/456,681, filed on Mar. 19, 2003, provisional application No. 60/395,847, filed on Jul. 11, 2002, provisional application No. 60/386,285, filed on Jun. 5, 2002.

(51) Int. Cl.
    *G06F 17/50* (2006.01)
(52) U.S. Cl. .................. 716/4; 716/19; 716/21
(58) Field of Classification Search .......... 716/4, 716/19, 21; 438/14, 16; 702/35, 81, 82
    See application file for complete search history.

(56) References Cited

U.S. PATENT DOCUMENTS

| 4,757,207 | A | 7/1988 | Chappelow et al. ........ 356/400 |
| 5,329,334 | A | 7/1994 | Yim et al. |
| 5,877,861 | A | 3/1999 | Ausschnitt et al. ......... 356/401 |
| 6,573,986 | B2 | 6/2003 | Smith ......................... 356/124 |
| 6,612,159 | B1 | 9/2003 | Knutrud ...................... 73/105 |
| 6,664,121 | B2 | 12/2003 | Grodnemsky et al. ........ 438/16 |
| 6,694,498 | B2 | 2/2004 | Conrad et al. ................. 716/4 |
| 6,732,004 | B2 | 5/2004 | Mos .......................... 700/114 |
| 6,819,426 | B2 | 11/2004 | Sezginer et al. ............ 356/401 |
| 6,928,628 | B2 | 8/2005 | Seligson et al. |
| 2002/0001083 | A1 | 1/2002 | Tabei |
| 2003/0115556 | A1 | 6/2003 | Conrad et al. ................. 716/4 |
| 2003/0223630 | A1 | 12/2003 | Adel et al. .................. 382/145 |

OTHER PUBLICATIONS

H.K. Nishihara et al, "Measuring Photolithographic Overlay Accuracy and Correlating Binarized Laplacian of Gaussian Convolutions," IEEE Trans. On Pattern Analysis and Machine Intelligence, vol. 10, No. 1, Jan. 1988, pp. 17-30.
Starikov A. et al., Accuracy of overlay measurements: tool and mark asymmetry effects, Optical Engineering, Soc. of Photo-Optical Instrumentation Engineers. Bellingham, US, vol. 31, No. 6, Jun. 1992, pp. 1298-1309.
Supplementary European Search Report dated Sep. 22, 2006, received in related European Application No. 03736896.6.
European Search Report dated Jan. 17, 2007, received in related European Application No. 3736896.6.

*Primary Examiner*—Sun James Lin
(74) *Attorney, Agent, or Firm*—Beyer Weaver LLP

(57) ABSTRACT

Disclosed are apparatus and methods for obtaining and analyzing various unique metrics or "target diagnostics" from one or more semiconductor overlay targets. In one embodiment, an overlay target is measured to obtain one or both of two specific types of target diagnostic information, systematic error metrics and/or random noise metrics. The systematic error metrics generally quantify asymmetries of the overlay target, while the random noise metrics quantify and/or qualify the spatial noise that is proximate to or associated with the overlay target.

33 Claims, 18 Drawing Sheets

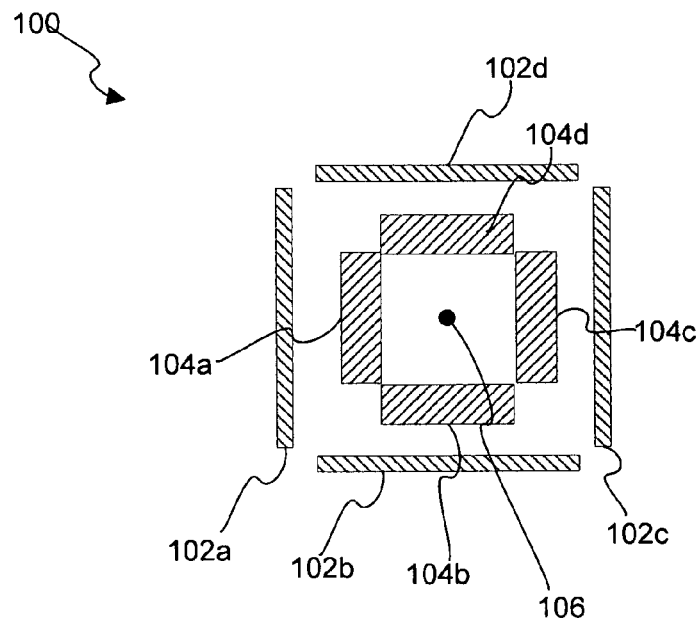
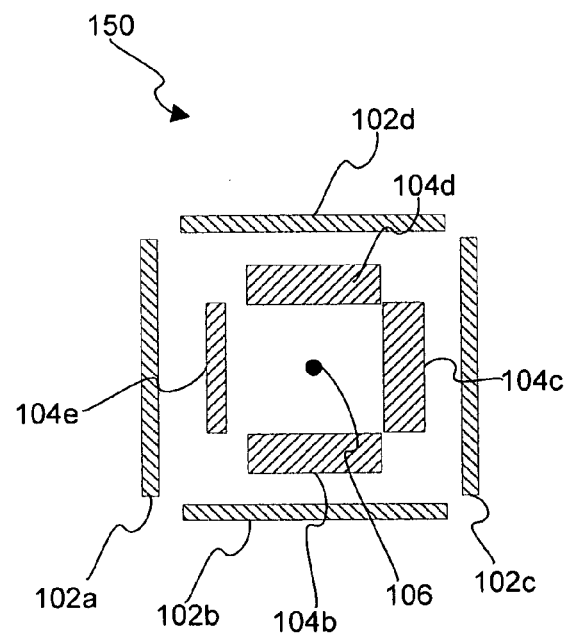 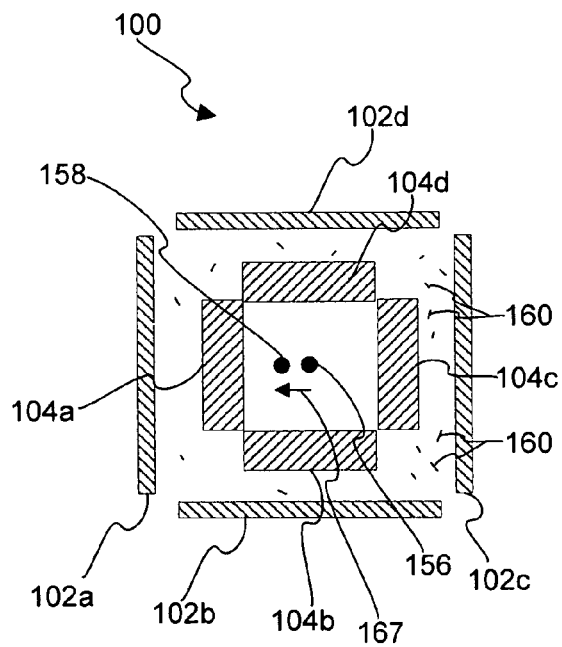
Figure 1A
Figure 1B          Figure 1C

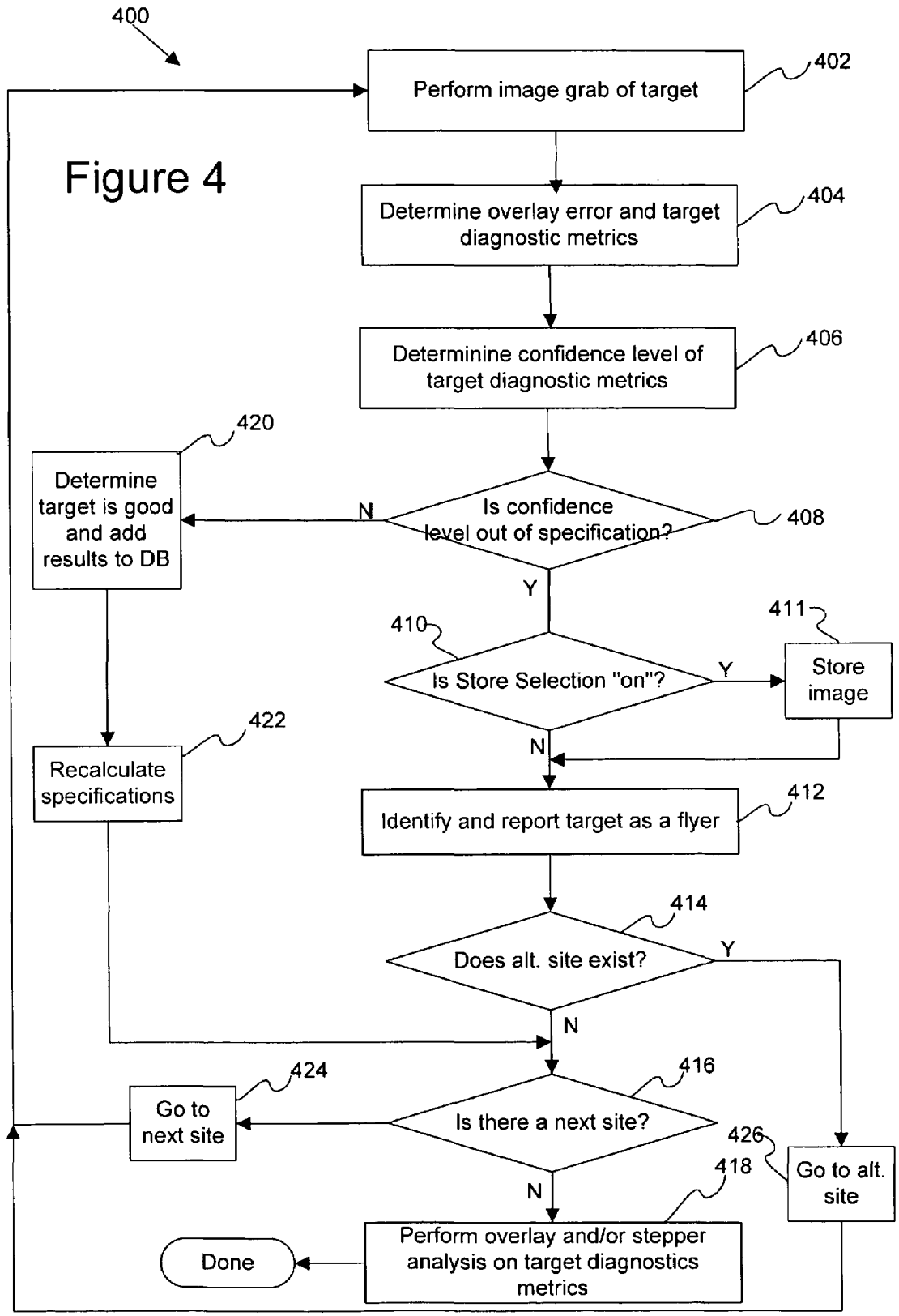

USE OF OVERLAY DIAGNOSTICS FOR ENHANCED AUTOMATIC PROCESS CONTROL

CROSS REFERENCE TO RELATED APPLICATIONS

This application is a continuation of U.S. patent application Ser. No. 10/438,963 filed on 14 May 2003 now U.S. Pat. No. 7,111,256, which claims priority of (i) U.S. Provisional Application No. 60/386,285, filed on 5 Jun. 2002, (ii) U.S. Provisional Application No. 60/395,847, filed on 11 Jul. 2002, and (iii) U.S. Provisional Patent Application No. 60/456,681 filed on 19 Mar. 2003. These applications are herein incorporated by reference in their entirety for all purposes.

BACKGROUND OF THE INVENTION

The present invention relates generally to overlay measurement techniques, which are used in semiconductor manufacturing processes. More specifically, the present invention relates to analyzing overlay marks (also called overlay targets) used for measuring alignment error between different layers or different patterns on the same layer of a semiconductor wafer film stack.

In the process of manufacturing semiconductor integrated circuits, one of the critical metrology steps is overlay or misregistration measurement. The overlay measurement ideally quantifies the lateral displacement between two layers of the integrated circuit from their nominal, perfect alignment. The lateral displacement is called overlay error or misregistration (herein referred to as overlay). This metrology is typically performed by a specialized optical instrument, overlay metrology tool, on test structures located either in the so-called scribe lines on the wafer or within the area of the integrated circuit itself. These test structures are called overlay targets. The overlay metrology tool reports, as the result of each measurement, two numbers, representing the overlay in two orthogonal directions in the plane of the wafer, labeled x and y. The overlay is measured on several locations on a wafer, and on several wafers of each processing lot. The results are used primarily for two purposes. One purpose of the overlay measurements is to facilitate decisions as to whether to pass or fail a given wafer lot (known as lot dispositioning), based on the overlay values or their combinations. Another purpose is to facilitate calculating what part of these errors was due to the non-ideal alignment or other functioning of the lithography stepper or scanner, and feeding this information back to the stepper or scanner to effect corrections (known as process control). This correction is determined using a stepper analysis program, based on stepper models.

Unfortunately, the reported overlay results may not be reliable in certain situations. That is, the measured overlay measurements may be affected by other factors besides misalignment of the target. The overlay measurement may be affected by background noise associated with the measured target. In one example, background may cause an overlay error to be measured when the target is not misaligned. Systematic errors, such as asymmetry may also cause the measured overlay error to be inaccurate. In another example, a target which has significant asymmetries, combined with a significant true overlay error, may result in zero measured overlay error. Thus, the asymmetry error may go unnoticed and steps to correct process problems leading to such asymmetry may go uninitiated and adversely affect yield.

Accordingly, there is a need for improved techniques for analyzing the quality and reliability of overlay targets. There is especially a need for taking into account systematic and noise contributions as they affect the reliability of the overlay measurements.

SUMMARY OF THE INVENTION

Accordingly, the present invention provides apparatus and methods for obtaining and analyzing various unique metrics or "target diagnostics" from one or more semiconductor overlay targets. In one embodiment, an overlay target is measured to obtain one or both of two specific types of target diagnostic information, systematic error metrics and/or random noise metrics. The systematic error metrics generally quantify asymmetries of the overlay target, while the random noise metrics quantify and/or qualify the spatial noise that is proximate to or associated with the overlay target.

These and other features of the present invention will be presented in more detail in the following specification of the invention and the accompanying figures which illustrate by way of example the principles of the invention.

BRIEF DESCRIPTION OF THE DRAWINGS

FIG. 1A is a diagrammatic top view of an example target structure.

FIG. 1B is a diagrammatic top view of an example target structure that is asymmetrical.

FIG. 1C is a diagrammatic top view of the target of FIG. 1A with a noisy background.

FIG. 4 is a flowchart illustrating a procedure for identifying flyer target data in accordance with one embodiment of the present invention.

DETAILED DESCRIPTION OF SPECIFIC EMBODIMENTS

Figure 2:
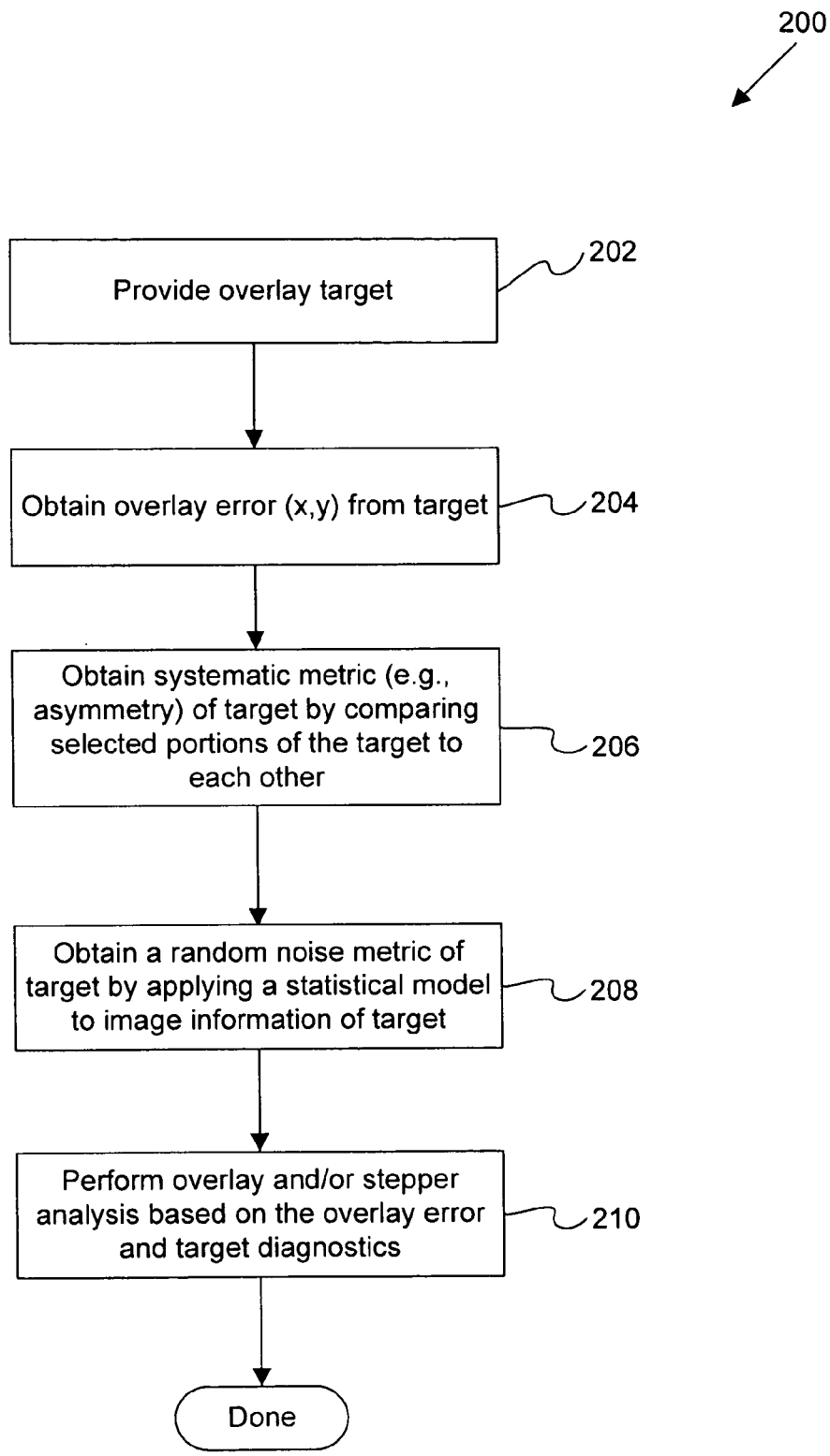
FIG. 2 is a flowchart illustrating a procedure for obtaining target diagnostics, including systematic and noise metrics, in accordance with one embodiment of the present invention.

Reference will now be made in detail to a specific embodiment of the invention. An example of this embodiment is illustrated in the accompanying drawings. While the invention will be described in conjunction with this specific embodiment, it will be understood that it is not intended to limit the invention to one embodiment. On the contrary, it is intended to cover alternatives, modifications, and equivalents as may be included within the spirit and scope of the invention as defined by the appended claims. In the following description, numerous specific details are set forth in order to provide a thorough understanding of the present invention. The present invention may be practiced without some or all of these specific details. In other instances, well known process operations have not been described in detail in order not to unnecessarily obscure the present invention.

Any suitable type of target may be used to practice the techniques of the present invention. That is, the target may take any suitable shape which facilitates measurements of overlay error. One well known overlay target shape is the box-in-box structure. Of course, there are various types of overlay target shapes, which may also be used with the techniques of the present invention. FIG. 1A is a diagrammatic top view of an example target structure 100. As shown, the target 100 is formed from an inner box 104 and an outer box 102. The inner box 104 is typically formed in a different layer than the outer box 102. For example, at the DI-stage the inner box 104 may be a resist pattern defining the Via2-layer, while outer box 102 is formed of features in a metal 2 layer. As shown, the inner box 104 is formed from a plurality of segments 104a through 104d which are arranged in a square pattern, while the outer box is formed from a plurality of segments 102a through 102d formed in a square pattern. The overlay error is typically determined by finding a center of each box and comparing the two centers to obtain an overlay error difference. This difference is typically expressed in x and y coordinates although the difference may be expressed in other forms, such as a vector. As shown, the inner box and outer box share a same center 106, indicating that there is no overlay error between the inner and outer box. In this case, the overlay error would be 0,0.

FIG. 1B is a diagrammatic top view of an example target structure 150 that is asymmetrical. As shown, the inner box 104 has a segment 104e that differs in width from the remaining segments 104b through 104d. Although this asymmetrical target 150 results in no overlay error because the inner box 104 and outer box 102 share a same center 106, the target 150 is defective because of the asymmetry. This type of defect is referred to as a systematic error. Systematic errors can be characterized per target, and they are often of systematic nature across the wafer. Systematic errors are typically due to target asymmetry, caused by process effects such as CMP polish, metal sputtering, or photoresist effects.

FIG. 1C is a diagrammatic top view of the target 100 of FIG. 1A with a noisy background 160. As shown, the background noise is in the form of grains. However, the noise may be caused by any source of spatial noise in the image. The noise 160 may cause the apparent center of either the inner box 104 or the outer box 102 to shift in direction 167, for example. Thus the resulting overlay error may be caused by random noise instead of an actual overlay error or a systematic error. These types of errors are referred to as random errors. The random errors are due to spatial noise caused by process effects such as graininess. These errors are characterized by the fact that their effect on targets across the wafer and even on a single target are statistical in nature.

One embodiment of the present invention includes techniques for obtaining metrics for the systematic errors and random noise errors. In other words, the target diagnostics obtained from a particular target includes separate systematic and random metrics, as well as the conventional overlay metrics. FIG. 2 is a flowchart illustrating a procedure 200 for obtaining target diagnostic metrics, including systematic and noise metrics, in accordance with one embodiment of the present invention. Initially, an overlay target is provided in operation 202. The overlay error is then obtained from the target in operation 204. That is, image information is obtained from the target and analyzed to obtain the overlay error, as described further below. The intensity signal or the image information may be analyzed to obtain the overlay error. To illustrate one overlay error measurement technique by way of the target of FIG. 1A, the difference between a center for the inner box 104 and the outer box 102 is measured, and such difference is defined as the overlay error.

A systematic metric, such as an asymmetry metric, is then obtained by comparing selective portions of the target to each other in operation 206. An asymmetry metric may be obtained using any suitable technique. In one embodiment, portions of the target which are designed to be symmetrical with respect to each other are compared. Preferably, the systematic error metric is obtained through a comparison of the nominally symmetrical signal forms from the different parts of the target, e.g. comparison between the signal from the left outer bar and right outer bar. As the overlay tool may have some asymmetry in its optics, it is advisable to measure the Asymmetry Metrics at two orientations of the wafer: 0° and 180°. The final systematic or asymmetry metric may be calculated as:

Asymmetry(final)=[Asymmetry(0°)−Asymmetry(180°)]/2.

For the example target of FIG. 1B, the left inner bar 104e is compared to the right inner bar 104c to obtain an x-direction asymmetry metric for the inner part of the target. Likewise, the left outer bar 102a may be compared with the right outer bar 102c to determine an x-direction asymmetry metric for the outer part of the target. The top inner bar 104d may be compared to the bottom inner bar 104b to determine whether the target has a y-direction asymmetry metric. Likewise, the outer top bar 102d may be compared with the outer bottom bar 102b to determine a y-direction asymmetry metric for the outer part of the target. These different x- and y-direction asymmetry metrics may then be combined into a final asymmetry metric. Specific techniques or algorithms for measuring the asymmetry of a target through comparison include Fourier-transform techniques, derivative (slope) techniques, overlap integral techniques, and center-of-gravity techniques.

A random noise metric of the target is then obtained by applying a statistical model to the image information (or intensity signal) of the target in operation 208. The target diagnostic metrics or target diagnostics refer herein to one or more of the following metrics: the systematic metric, the random noise metric, or a combination of the two. An overlay and/or stepper analysis may then be performed based on the overlay metrology results and target diagnostic metrics in operation 210. The procedure then ends.

In one general application, the target diagnostics metrics may be used to analyze the overlay data to determine its accuracy and reliability. For instance, overlay data that contains a high noise metric value and/or a high asymmetry metric value may be identified as less reliable or unreliable and possibly thrown out from the overlay measurements that are collected from multiple targets prior to analysis of such overlay data. In a specific application, the target diagnostic metrics are used to determine a confidence level of the overlay error. In other applications, the overlay error data may be weighted or qualified based on the noise and/or asymmetry metrics prior to processing of the overly data for various uses, such as determining a stepper correction, or determining whether a lot passes or fails a given specification. In other applications, the target diagnostics data may be used to determine that a different overlay error measurement setup (measurement type, measurement algorithm, etc.) or a different target is to be used when the target diagnostics metrics indicate that the current overlay data is unreliable. Several embodiments of techniques for using the target diagnostic data are described further below.

Figure 3A:
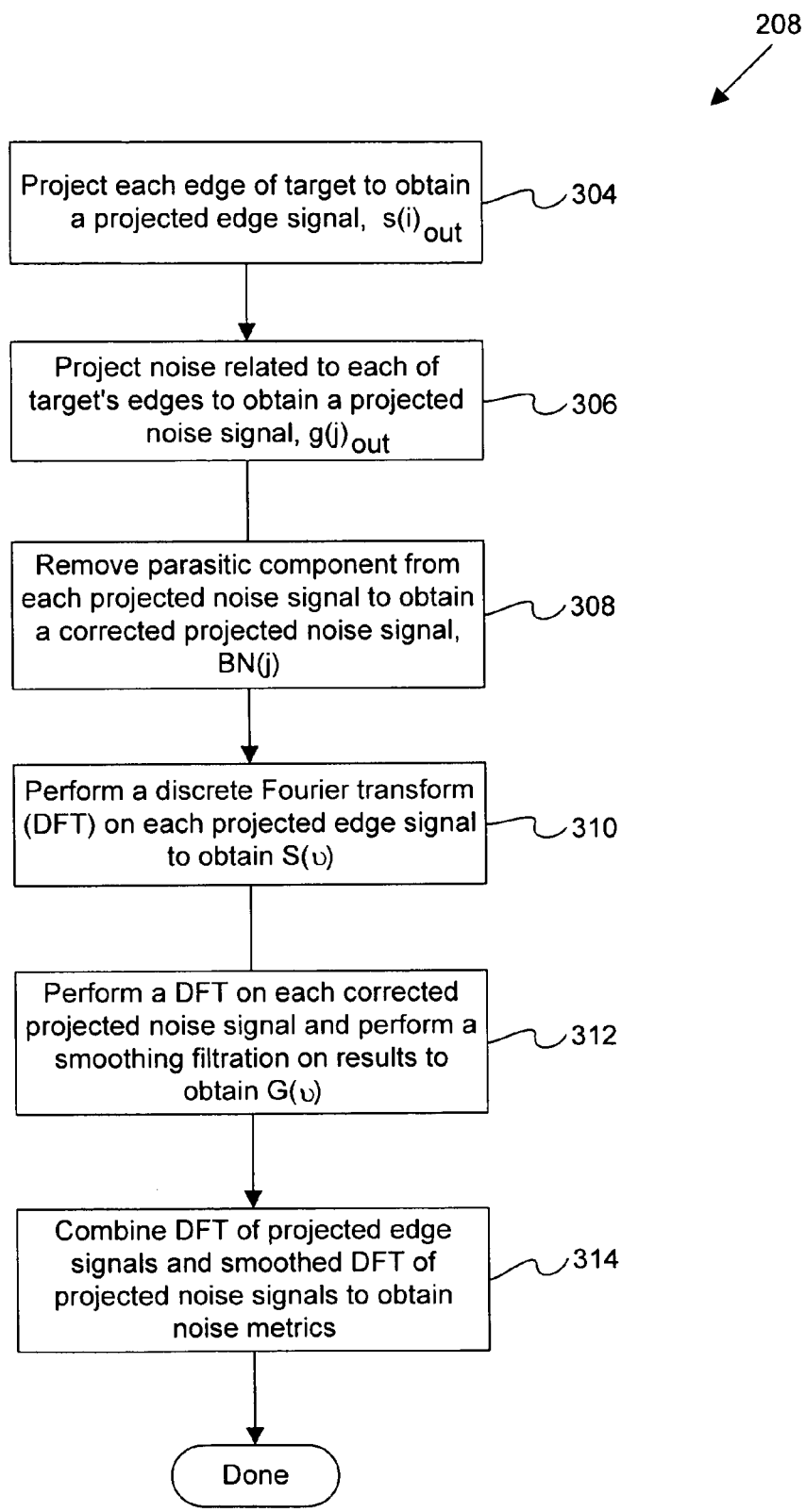
FIG. 3A is a flowchart illustrating the operation of FIG. 2 of obtaining the random noise metric in accordance with one embodiment of the present invention.

Any suitable technique for characterizing noise data may be implemented to obtain a noise metric for a target. By way of examples, the following noise determination algorithms may be used: statistical algorithms, integrated noise algorithms, integrated derivative algorithms, signal-to-noise algorithms, or spectrum of noise algorithms. FIG. 3A is a flowchart illustrating the operation 208 of FIG. 2 of obtaining the random noise metric in accordance with one embodiment of the present invention. Initially, each inner (INN) and outer (OUT) edge (which may be: edge, bar, multi-bar, segmented bar, row or multi-row of vias of contact holes) of the target is projected to obtain a projected edge signal, $s(i)_{OUT}$ (the same for inner, where i is an index, its maximum is equal to the ROI length $L_{OUT}$), in operation 304. The noise which is related to each of the target's edges is then projected to obtain a projected noise signal, $g(j)_{OUT}$ (where j is an index, its maximum is equal to the ROI length in direction perpendicular to the edge), in operation 306.

Figure 3B:
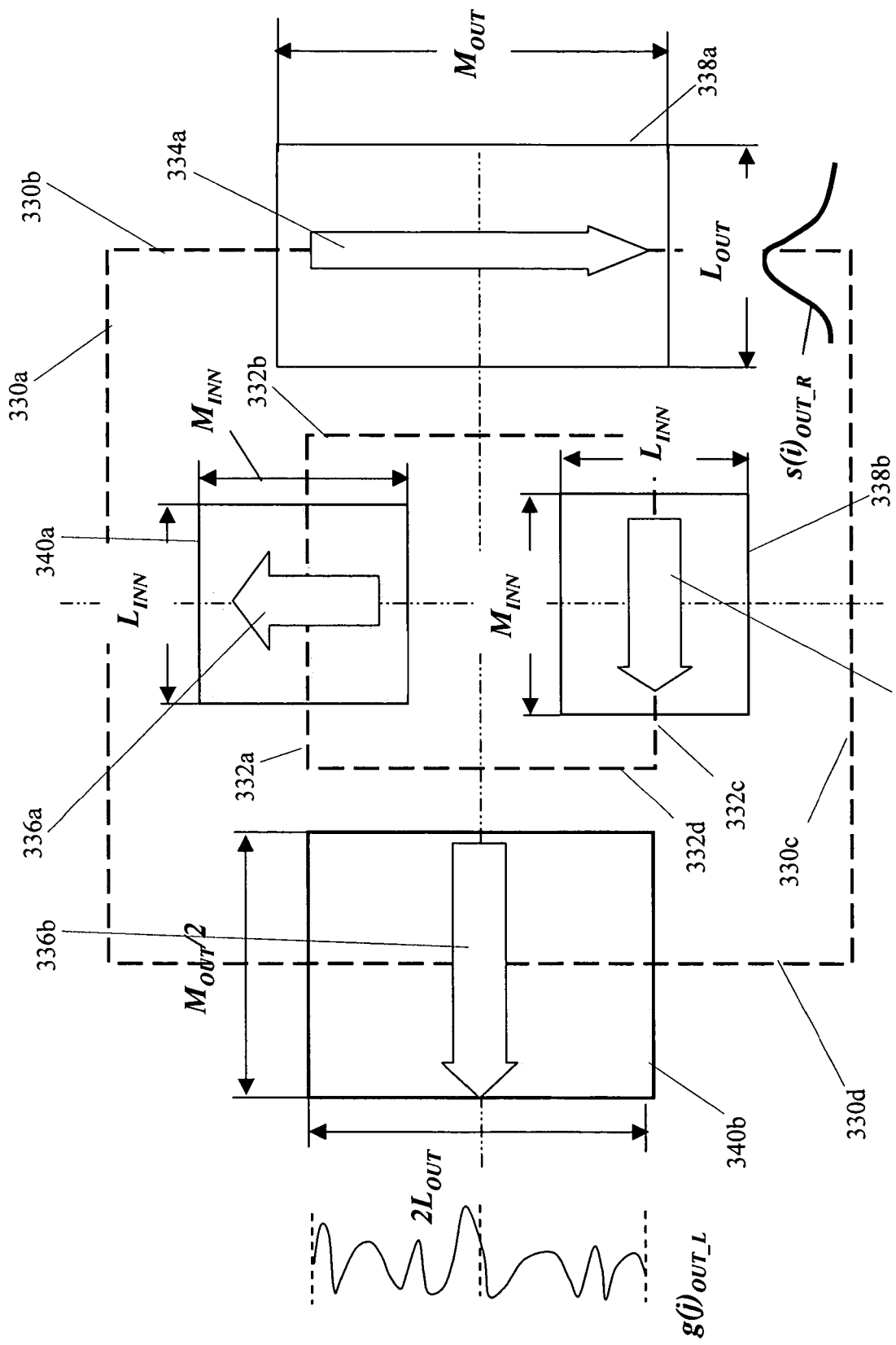
FIG. 3B is a diagrammatic representation of a target having an inner box and an outer box and an accompanying noise background upon which the edge and noise projection techniques of FIG. 3A are illustrated.

FIG. 3B is a diagrammatic representation of a target having an inner box 332 and an outer box 330 and accompanying background noise. An edge projection is performed along each edge of the feature. In the example of FIG. 3B, an edge projection is performed on inner edges 332a~332d and outer edges 330a~330d. A region of interest (ROI) is first selected for each edge, and a projection is taken of each ROI parallel to the edge. As shown, outer edge 330b has ROI 338a having width $M_{OUT}$ and length $L_{OUT}$, and inner edge has ROI 338b having width $M_{INN}$ and length $L_{INN}$. The dimensions of the each edge's ROI depends on the following factors: ROI length depends on the target edge length and should include all the edge profile points in the projected signal. ROI width depends on the box size (usually it's equal to 50-70% of the box size). A projection $S(i)_{OUT\_r}$ is shown illustrated for the outer right edge 330b. A ROI for the noise projection is also selected for each edge. As shown, the left outer edge 330d has ROI 340b having width $M_{OUT}/2$ and length $2L_{OUT}$, and the top inner edge 332a has ROI 340a having width $L_{INN}$ and length $M_{INN}$. The dimensions of each noise projection's ROI is selected based on the dimensions of the signal projection's ROI (equal or in ratios from 1:2 to 2:1). A noise projection of each edge's ROI perpendicular to the edge is then taken. In the illustrated embodiment of FIG. 3B, a noise projection $g(j)_{OUT\_L}$ results from taking a noise projection of ROI 340b perpendicular to left outer edge 330d.

Figure 3C:
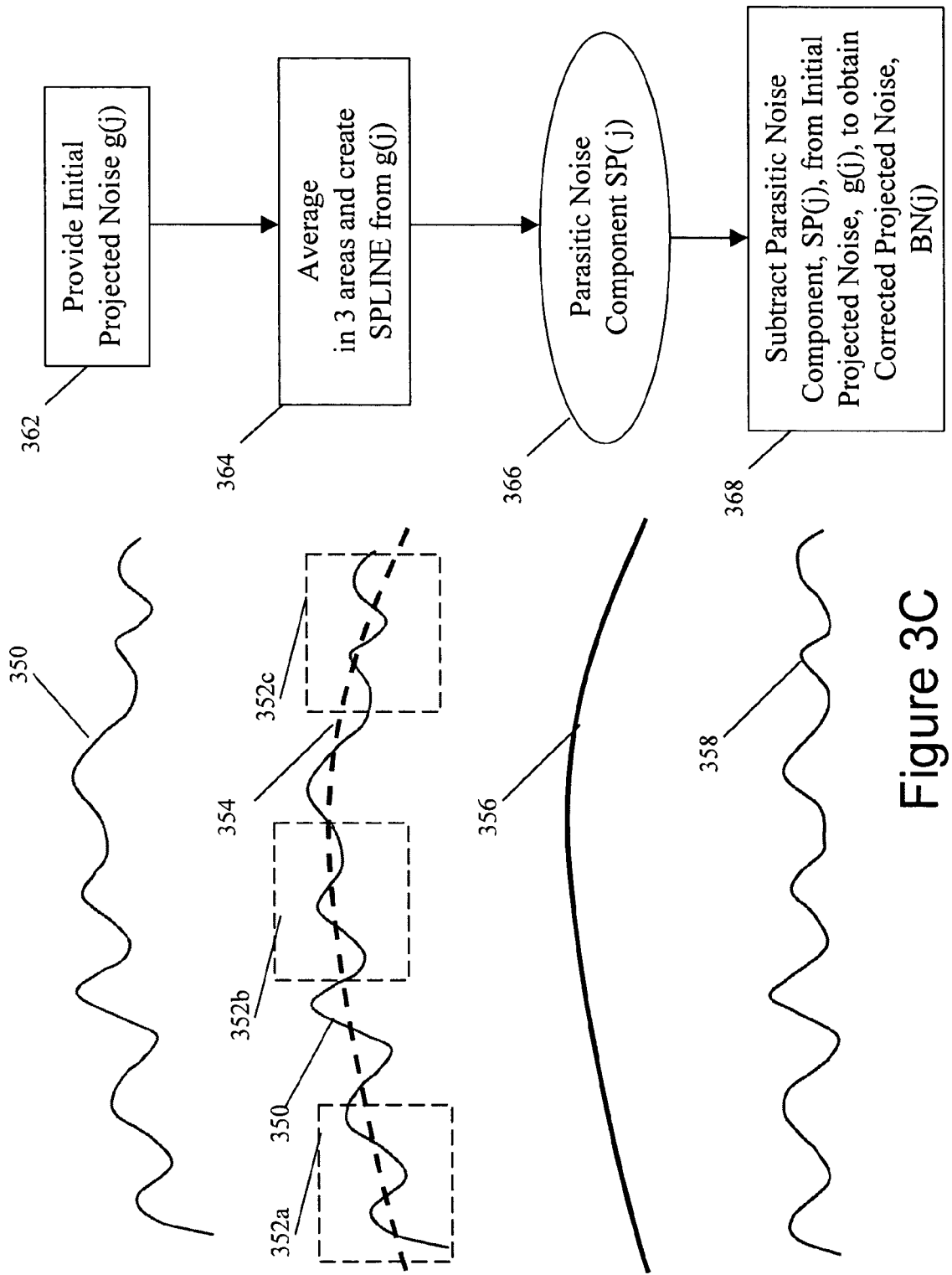
FIG. 3C illustrates one technique for removing the parasitic noise component from the projected noise signal in accordance with one embodiment of the present invention.

Some parasitic component could appear due to the light non-uniformity. After the noise projections are obtained, the individual parasitic components may then be removed from each projected noise signal to obtain a corrected projected noise signal, BN(j), as illustrated in operation 308 of FIG. 3A. Any suitable technique for removing the parasitic noise component may be implemented. Some well known techniques are referred to as best fit procedure or spline. FIG. 3C illustrates one technique for removing the parasitic noise component from a projected noise signal in accordance with one embodiment of the present invention. Initially, the initial projected noise g(j) 350 is provided in operation 362. An average is then taken in multiple areas of the projected noise signal and a spline is created from the projected noise signal g(j) in operation 364. A spline is generally an N-power interpolation procedure where N is equal to the number of areas minus one. Although any number of areas may be averaged, three areas 352a-352c of the projected noise signal 350 are averaged to obtain spline 354 in the illustrated embodiment. Accordingly, a parasitic noise component SP(j) 356 is then obtained in operation 366. That is, the spline is defined as the parasitic noise component. The parasitic noise component, SP(j), is then subtracted from the initial projected noise, g(j), to obtain a corrected projected noise signal BN(j) 358 in operation 368.

Figure 3E:
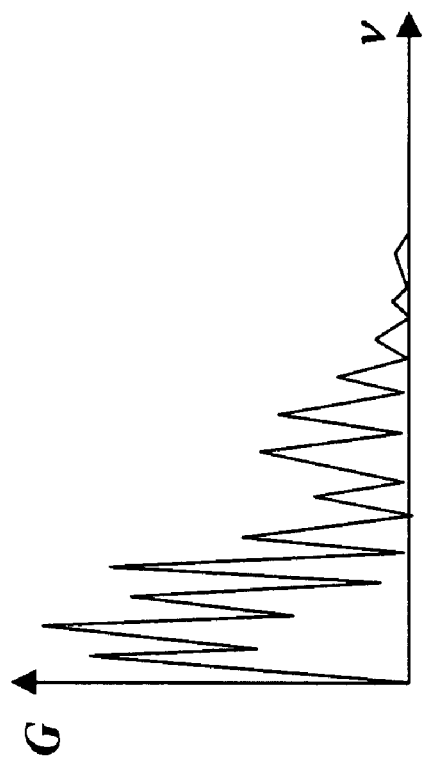
FIG. 3E is a graph of an example DFT results of a projected noise signal, $G(\upsilon)$.
Figure 3F:
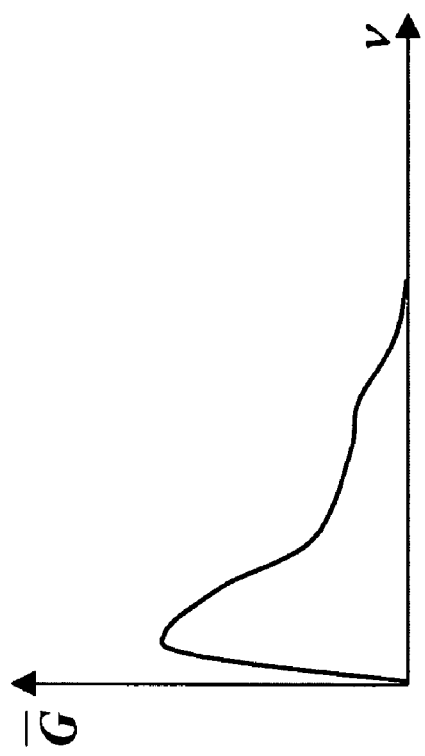
FIG. 3F is a graph of an example of a smoothed DFT of a projected noise signal, $!G(\upsilon)$.
Figure 3D:
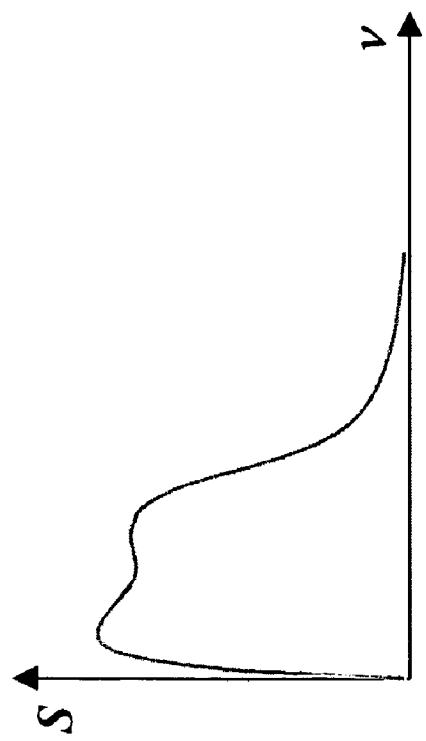
FIG. 3D is a graph of an example of DFT results of a projected edge signal, $S(\upsilon)$.

Referring back to FIG. 3A, a discrete Fourier transform (DFT) is then performed on each projected edge signal to obtain DFT with module S(υ) in operation 310 (where υ is index). FIG. 3D is a graph of an example S(υ) signal, the DFT module of a projected edge signal. A DFT is then performed on each corrected projected noise signal to obtain the module G(υ) and a smoothing filtration function is then performed on the results to obtain $\overline{G}(υ)$ in operation 312. FIG. 3E is a graph of an example G(υ) signal, the DFT module of a projected noise signal, and FIG. 3F is a graph of an example $\overline{G}(υ)$ signal, the smoothed DFT module of the projected noise signal G(υ) of FIG. 3E. The DFT modules of the projected edge signals and the smoothed DFT modules of the projected noise signals are then combined to obtain the noise metric in operation 314. For example, the $\overline{G}(υ)$ signal of FIG. 3F is combined with the S(υ) signal of FIG. 3D. In one implementation, the noise metric is:

$$\text{noise metric} = k_{EL} k_S L \frac{\sqrt{\sum_{v=1}^{L/2} |S(v)|^2 \cdot v^2 \cdot |\overline{G}(v)|^2}}{\sum_{v=1}^{L/2} |S(v)|^2 \cdot v^2}$$

$k_{EL}$ equals 62, L equals 64, and $k_S$ is defined as:

$$k_S = k_{SR}(1+((KD-1)\cdot KK \cdot (K_{SR}-1)/(KSS-1)))$$

where KSS equals 3.45, KK equals 1.5, and KD is defined as:

$$KD = \frac{1}{2}\sqrt{\frac{L\sum_{i=1}^{L/2}\overline{G}(i)}{\sum_{i=1}^{L/2}[\overline{G}(i)*i]}}$$

and $k_{SR}$ is defined as:

$$k_{SR} = \frac{KSS \cdot |s(1) - s(L)|}{\max(s) - \min(s)}$$

Target diagnostics may then be used to produce, in parallel with the overlay measurement described above, quantitative metrics on the quality of the measured overlay targets. These quantitative metrics may be used for any suitable purpose in relation to analysis of the overlay measurements. In general, the target diagnostics are used together with the overlay measurements during overlay and stepper analysis procedures. Several example uses for the target diagnostics are described further below.

Flyer Removal

In one application of the target diagnostics, overlay metrology occasionally produces an abnormally high measurement result, e.g. 500 nm for a process where typical values are well below 100 nm. These results are called "flyers", and their removal from the data is important, as they corrupt the decisions that are based on the data set. Some of them may be removed by simple thresholding of the overlay value, but this reduces the confidence level of the decisions. In one embodiment of a use of the target diagnostics, the quality of the target is evaluated, and the targets are automatically labeled as flyers or unreliable targets when the quality or confidence level falls below a pre-set quantity. The decision may be done without regard to the actual overlay value of these targets. The data from the flyer targets may then be disregarded in the metrology process, and the flyer targets may also be automatically replaced by data from alternative targets and/or alternate metrology methods or algorithms.

FIG. 4 is a flowchart illustrating a procedure 400 for identifying flyers within the target diagnostic data in accordance with one embodiment of the present invention. Initially, an image grab of a target is performed in operation 402. Overlay error and target diagnostics metrics are then determined in operation 404. That is, an overlay error, a systematic metric, and a noise metric are determined as described above. The confidence level of the target diagnostic metrics is then determined in operation 406. It is then determined whether the confidence level is out of specification in operation 408.

If the confidence level is out of specification, it then may be determined whether a stored selection variable is set "on" in operation 410. For instance, a user may have set the store variable to "on" so as to store images corresponding to measurements for which the target metrics are out of specification for later review and analysis. If the store selection variable is set "on", an image may be stored in operation 411. Otherwise, storing of the image is skipped. Operations 410 and 411 are optional: and the image may be stored automatically without a user selecting whether to turn on or turn off such storing feature. The target is then identified and reported as a flyer in operation 412. It then may be optionally determined whether an alternative site exists in operation 414. For instance, the metrology recipe may include an alternative target site when the initial site proves to be out of specification. Preferably, the alternative site is proximate to the out-of-spec or rejected site. If there is an alternative site, the overlay metrology tool then goes to the alternative site operation 426. The procedure 400 is then repeated in operation 402, where an image is grabbed of the alternative site.

If there is no alternative site, it is then determined in operation 416 whether there is a next target site in the metrology recipe. If there is not a next site, the overlay metrology of the current wafer is terminated, and overlay and/or stepper analysis may then be performed on the good target diagnostics metrics in operation 418 and the procedure ends. If there is a next site, the tool moves to the next site in operation 424. The procedure 400 is then repeated for the next target site in operation 402, where an image grab is performed on the next site.

When the confidence level is not out of specification for the current target, the current target is determined to be good and the results are added to a overlay database in operation 420. The specification for flyer may also be recalculated based on the new target diagnostic data in operation 422. It is then determined whether there is a next target site in operation 416. If there is a next target, the procedure repeats for the next target. If there is not a next target, the procedure ends.

The specification may be recalculated when it is determined that the confidence levels for several product wafers have drifted up to higher confidence levels or down to lower confidence levels. In one example, an initial specification may require that the confidence level be over 70%. However, when the confidence level for hundreds of consecutive targets start reaching average values of over 90%, the confidence level requirement may be altered to 85%. In one embodiment, the specification may be recalculated to be within 3 standard deviations of the mean target diagnostic metric value. That is, expectations regarding a targets quality may increase or decrease over time as new targets are designed and new processes emerge. Additionally, if several flyers are identified consecutively, the flyers may then be examined to determine a new specification or to adjust the process.

Figure 5:
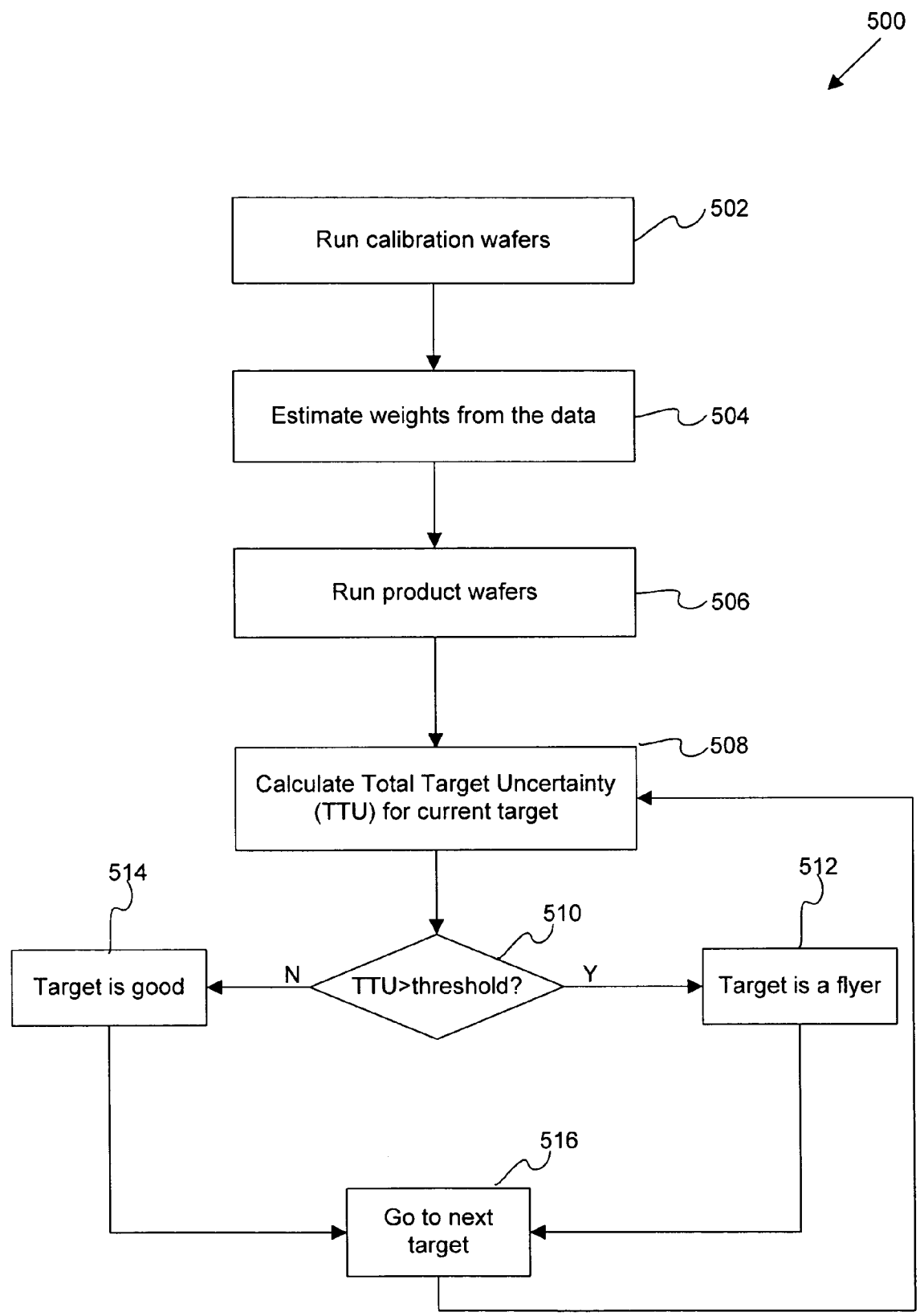
FIG. 5 is a flowchart illustrating a procedure for determining the confidence level of a particular overlay target's data in accordance with a first embodiment of the present invention.

Any suitable techniques may be used to calculate a confidence level for the target overlay data based on the provided systematic and/or noise metrics. FIG. 5 is a flowchart illustrating a procedure 500 for determining the confidence level of particular overlay data in accordance with a first embodiment of the present invention. Initially, a set of calibration wafers are run in operation 502. The weight values for the target diagnostic metric are estimated from the data in operation 504. The data is generally raw overlay and metrics values. The product wafers are then run in operation 506. A total target uncertainty (TTU) is then calculated for the current target in operation 508. TTU is defined as, for example, the target of FIGS. 1A~1C or FIG. 3B $$TTU = A * \frac{|AsymmetryInnerX| + |AsymmetryInnerY|}{2} +$$
$$B * \frac{|AsymmetryOuterX| + |AsymmetryOuterY|}{2} +$$
$$\sqrt{C * \frac{(NoiseMetricX)^2 + (NoiseMetricY)^2}{2}}$$

where A, B, and C are weights. The units may be any unit of measurement, such as nm.

After the TTU value is determined, it is then determined whether the TTU is above a predetermined threshold in operation 510. If the TTU is not above the threshold, the target is determined to be good in operation 514. If the TTU is above the threshold, the target is defined as a flyer in operation 512. This procedure may then be repeated for each target by going to the next target in operation 516.

Figure 6:
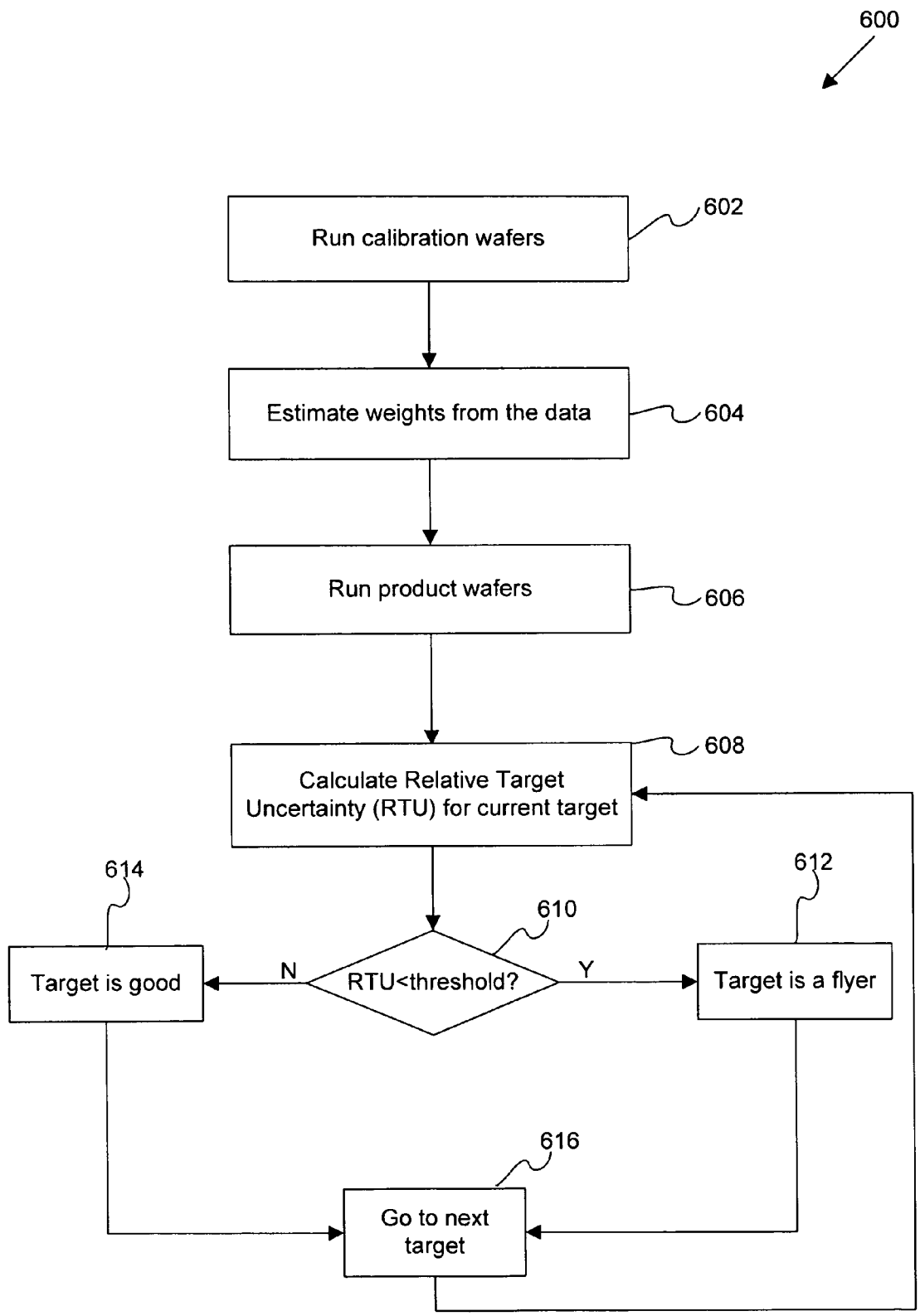
FIG. 6 is a flowchart illustrating a procedure for determining the confidence level of a particular overlay target's data in accordance with a second embodiment of the present invention.

FIG. 6 is a flowchart illustrating a procedure 600 for determining a confidence level in accordance with a second embodiment of the present invention. The operations 602-606 are similar to the operations 502-506 of FIG. 5. However, in this embodiment a relative target uncertainty (RTU) value is calculated for the current target in operation 608. In this embodiment, the confidence level result is relative to the overlay budget or some other variable, and translated to a relative notation, such as a %. RTU may be defined relative to the TTU value and a Reference Value as:

$$RTU = \left(1 - \frac{TTU}{ReferenceValue}\right) * 100\%$$

The Reference Value is generally determined by the overlay budget or some other representative process value. After the RTU value is determined, it is then determined whether the RTU value is less than a predetermined threshold in operation 610. If the RTU is not less than the threshold, the target is good in operation 614. If the RTU is less than the threshold, the target is a flyer in operation 612. One then may then go to the next target in operation 616.

Figure 7:
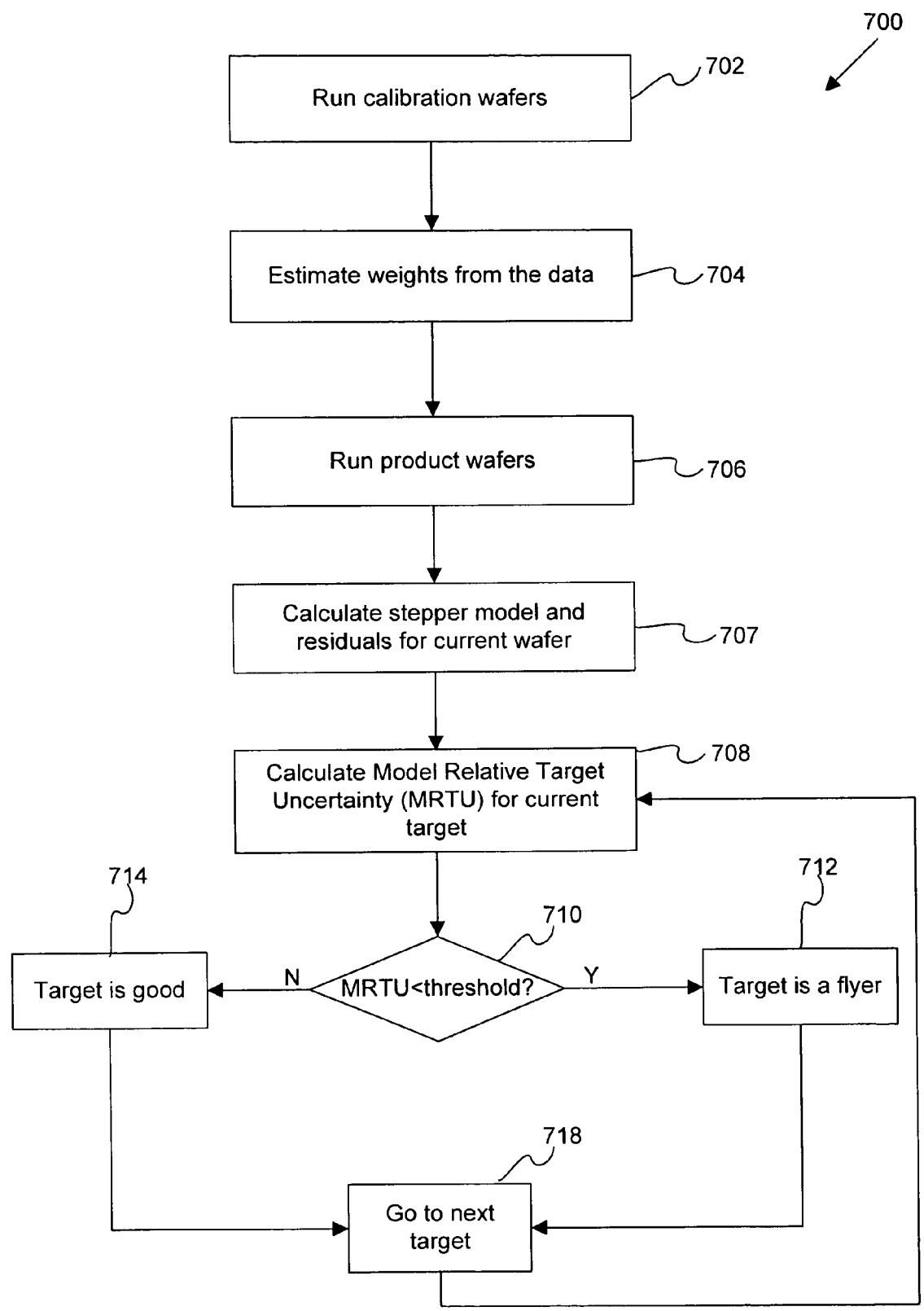
FIG. 7 is a flowchart illustrating a procedure for determining the confidence level of a particular overlay target's data in accordance with a third embodiment of the present invention.

FIG. 7 is a flowchart illustrating a procedure 700 for determining a confidence level in accordance with a third embodiment of the present invention. This third embodiment is similar to the RTU, but the result is relative to the stepper model residuals. The stepper model residuals are generally defined as the difference between the raw overlay data and the values predicted by the stepper model.

Operations 702-706 are similar to the operations 502-506 of FIG. 5. However, after a set of product wafers are run in operation 706, a stepper model and the residuals for a current wafer are calculated in operation 707. A model relative target uncertainty (MRTU) value is then calculated for the current target in operation 708 by:

$$MRTU = \left(1 - \frac{TTU^2}{(3\sigma ResidualsX^2 + 3\sigma ResidualsY^2)/2}\right) * 100\%$$

It is then determined whether the MRTU value is less than a predetermined threshold in operation 710. If the MRTU is not less than the threshold, the target is good in operation 714. If the MRTU is less than the threshold, the target is a flyer in operation 712. One may then go to the next target in operation 718.

Figure 8:
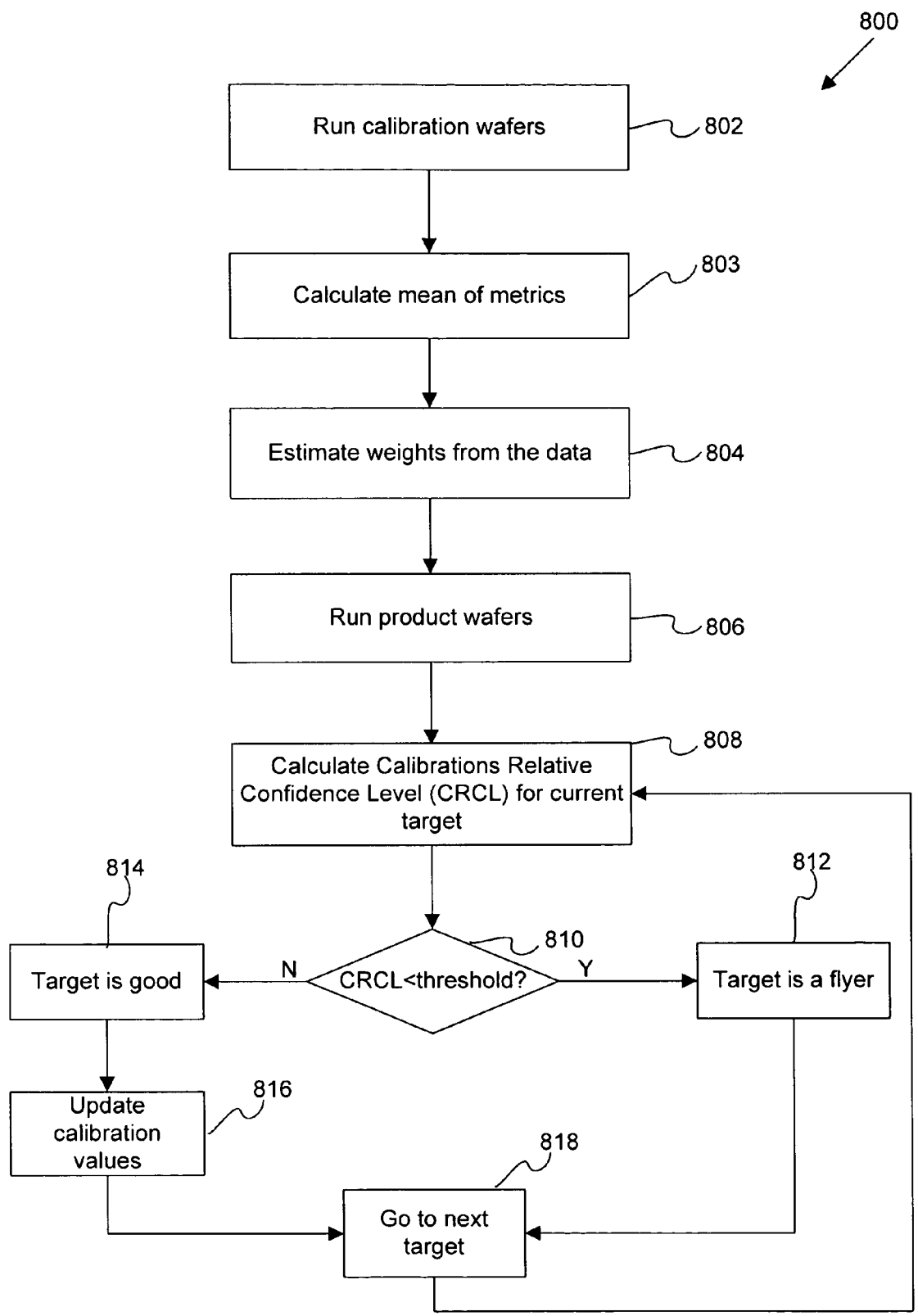
FIG. 8 is a flowchart illustrating a procedure for determining the confidence level of a particular overlay target's data in accordance with a fourth embodiment of the present invention.

FIG. 8 is a flowchart illustrating a procedure 800 for determining a confidence level with a fourth embodiment of the present invention. In general terms, this technique is based on the relative accuracy of the current target metric with respect to calibration data. Calibration wafers (lot, set of lots) are run and means of the metrics are calculated. Then for the current run, the relative accuracy of the metric is calculated. And at the final step, the results are added to the calibration data and means are recalculated.

Initially, a set of calibration wafers are run in operation 802, and the means of the metrics for the calibration wafers are then calculated in operation 803. The weights are then estimated based on the data in operation 804. A set of product wafers are then run in operation 806. A calibration relative confidence level (CRCL) value is then calculated for the current target in operation 808. The CRCL may be defined as for example, the target of FIGS. 1A~1C or FIG. 3B as:

$$CRCL = \left[6 - \left(A * \left|\frac{CurrentAsymInnX - CalibrationAsymInnX}{CalibrationAsymInnX}\right| + \right.\right.$$
$$B * \left|\frac{CurrentAsymInnY - CalibrationAsymInnY}{CalibrationAsymInnY}\right| +$$
$$C * \left|\frac{CurrentAsymOutX - CalibrationAsymOutX}{CalibrationAsymOutX}\right| +$$
$$D * \left|\frac{CurrentAsymOutY - CalibrationAsymOutY}{CalibrationAsymOutY}\right| +$$
$$I * \left|\frac{CurrentNoiseX - CurrentNoiseX}{CalibrationNoiseX}\right| +$$
$$\left.\left.G * \left|\frac{CurrentNoiseY - CurrentNoiseY}{CalibrationNoiseY}\right|\right)\right] * 100\%$$

wherein A,B . . . G are weights; the CurrentAsymOutX and Y are the asymmetry between the pair of outer X bars (or boxes) and between the pair of outer Y bars (or boxes), respectively; CurrentAsymInnX and Y are the asymmetry between the pair of inner X bars (or boxes) and between the pair of inner Y bars (or boxes), respectively; and the Calibration values are the corresponding calibration values for the same. A default value for the weights equal to 1 may be initially used.

The CRCL may be also defined as, the target of FIGS. 1A~1C or FIG. 3B as $$CRCL = \min\left(A * \Phi\left(\frac{|CalibrationAssymInnX| + SigmaCalibrationAssymInnX - |CarrentAssymInnX|}{SigmaCalibrationAssymInnX}\right), \ldots, \right.$$

-continued $$B*\Phi\left(\frac{|CalibrationAssymInnY|+S*SigmaCalibrationAssymInnY-|CurrentAssymInnY|}{SigmaCalibrationAssymInnY}\right), \ldots,$$

$$C*\Phi\left(\frac{|CalibrationAssymOutX|+S*SigmaCalibrationAssymInnX-|CurrentAssymOutX|}{SigmaCalibrationAssymOutX}\right), \ldots,$$

$$D*\Phi\left(\frac{|CalibrationAssymOutY|+S*SigmaCalibrationAssymInnY-|CurrentAssymOutY|}{SigmaCalibrationAssymOutY}\right), \ldots,$$

$$E*\Phi\left(\frac{|CalibrationInnerRNTDX|+S*SigmaCalibrationInnerRNTDX-|CurrentInnerRNTDX|}{SigmaCalibrationInnerRNTDX}\right), \ldots,$$

$$F*\Phi\left(\frac{|CalibrationInnerRNTDY|+S*SigmaCalibrationInnerRNTDY-|CurrentInnerRNTDY|}{SigmaCalibrationInnerRNTDY}\right), \ldots,$$

$$G*\Phi\left(\frac{|CalibrationOuterRNTDX|+S*SigmaCalibrationOuterRNTDX-|CurrentOuterRNTDX|}{SigmaCalibrationOuterRNTDX}\right), \ldots,$$

$$H*\Phi\left(\frac{|CalibrationOuterRNTDY|+S*SigmaCalibrationOuterRNTDY-|CurrentOuterRNTDY|}{SigmaCalibrationOuterRNTDY}\right)\right)*100$$

Where "Calibration . . . " is average of the historical data, "SigmaCalibration . . . " is standard deviation of the historical data, $\Phi(*)$ is right tail of Standard Normal Distribution, A,B,C,D,E,F,G,H are the weights, and S is distance in the sense of sigma's. Actually, this value determines the confidence level of the mean of historical data. For example, if S=3, the confidence level of the historical mean is 99.865%.

The units of the values is [%]. The range of the value is from 0% to 100%. The default values for A, . . . ,F are one's, and the default value for S is 3. The CurrentAsymOutX and Y are the asymmetry between the pair of outer X bars (or boxes) and between the pair of outer Y bars (or boxes), respectively; CurrentAsymInnX and Y are the asymmetry between the pair of inner X bars (or boxes) and between the pair of inner Y bars (or boxes), respectively.

After the CRCL is determined, it is then determined whether the CRCL value is less than a predetermined threshold in operation 810. If the CRCL value is not less than the threshold, the target is good in operation 814. The calibration values are also updated in operation 816. New values are added to the historical data (database) and then means, sigmas and cumulative distributions are recalculated on the data with new values. If the CRCL value is less than the threshold, the target is a flyer in operation 812. One may then go to the next target in operation 818 and repeat operations 808-816.

Increasing the Confidence of a Lot's Pass/Fail Decision

Overlay metrology after the lithography step may be used for providing one of the indicators for passing or failing a wafer lot. Especially in the case where the overlay metrology results fail the pass criteria, a pass/fail decision may be done based on subjective judgment, often after additional overlay metrology. By providing target diagnostics such as a systematic error and/or noise metric from the overlay targets and by converting the results into confidence levels relating to each overlay result, a more intelligent, and possibly further automated, decision for pass/fail becomes possible. Moreover, in the case of a "fail" decision, an automated decision process may take place, based on the specific confidence level results.

Figure 9:
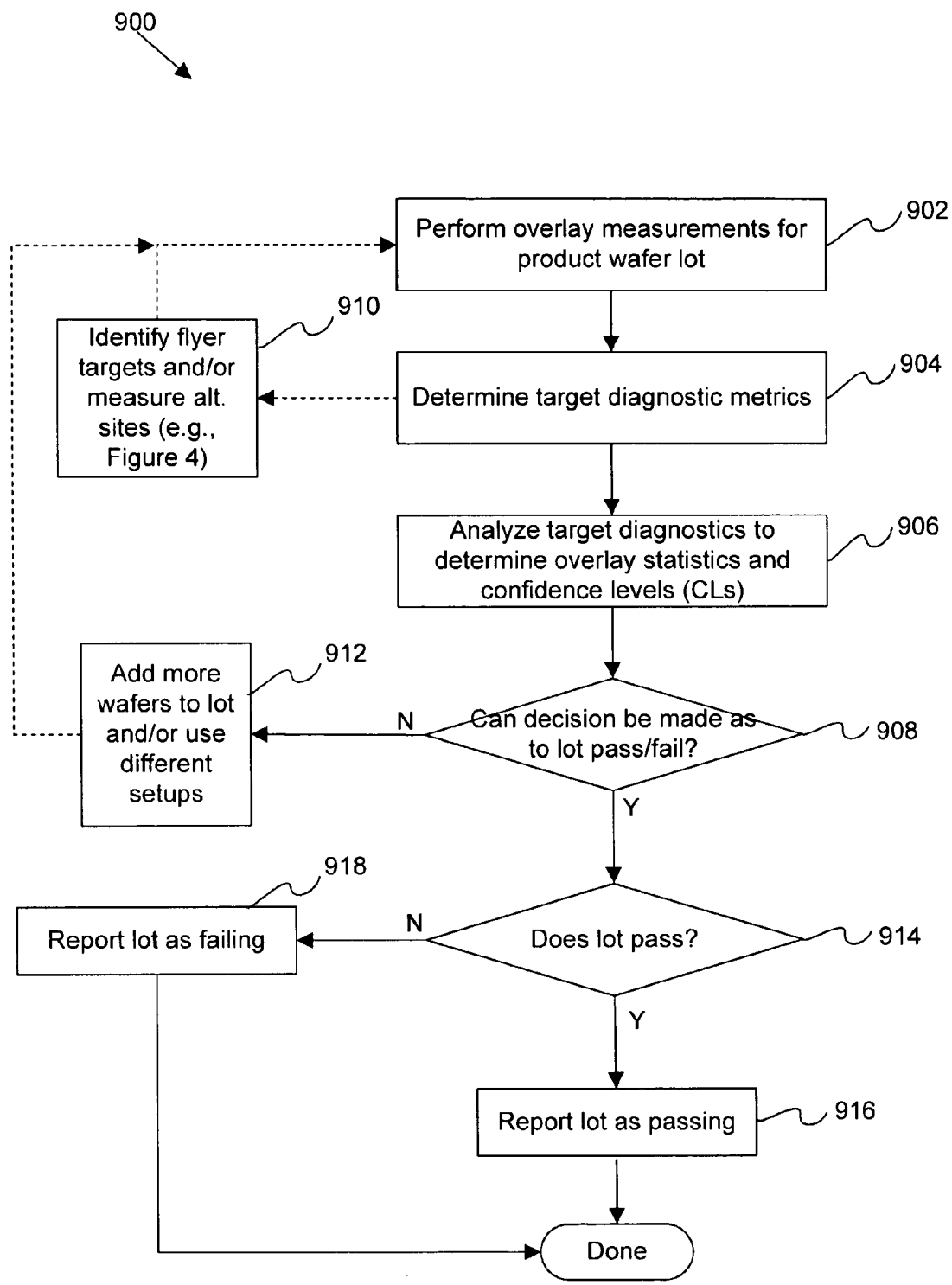
FIG. 9 is a flowchart illustrating a lot disposition procedure in accordance with one embodiment of the present invention.

FIG. 9 is a flowchart illustrating a lot disposition procedure 900 in accordance with one embodiment of the present invention. As product wafers and/or product lots are being processed, each product wafer or product wafer lot may be rated as passing or failing based on this procedure. Initially, overlay measurements are performed for a particular product wafer lot in operation 902. The target diagnostic metrics (e.g. systematic and noise metrics) are then determined in operation 904.

This procedure may include one of two loops: a wafer-level loop ("Wafer Auto") where flyer targets are identified and/or alternative sites measured (e.g., as described for FIG. 4) or alternative measurement types or algorithms are performed in operation 910, and a lot-level loop ("Lot Auto") as illustrated by operation 912 for adding more wafers to the lot. The wafer-level loop may take place while a given wafer is being measured. For each target, the target diagnostics indicate in real-time whether the target is acceptable. If the target is not acceptable, a real-time decision may be made to measure an alternate target, which has been designated already in the recipe set-up phase. In this way, the data that results from measuring a given wafer is all good data (provided that the wafer contains a sufficient number of good targets). A flyer target may also simply be removed from the target diagnostic data for a particular wafer without measurement of an alternative target or implementation of an alternative measurement algorithm. The procedures described above for removing flyers from the target diagnostics data and using alternative targets may be implemented.

In some cases, this wafer-level loop is not possible due to the constraints of the specific user. In these cases, a lot-level strategy may be used, where an indication is given after each wafer or lot measurement on the quality of the measurement. This quality indication is again based on the confidence levels given by the target diagnostics. Based on the measurement quality, a decision is taken—either by the overlay tool, a supervisory system, or a user—whether to measure additional wafers of the same lot. All this may take place while the lot is still on the overlay metrology tool, thus avoiding unnecessary logistical overhead of unloading, storing, retrieving and reloading a lot. The lot-level loop and the wafer-level loop may be implemented together or alone. That is, the wafer-level loop may be implemented without the lot-level loop, and visa versa.

Referring to the illustrated embodiment, after the target diagnostics data is filtered to weed out flyer data, the target diagnostics may then be analyzed to determine overlay statistics and confidence levels in operation 906. The statistics may include any suitable overlay statistical data compiled from results of measuring overlay targets from multiple wafers or wafer lots. This statistical information may later be utilized to determine whether a particular wafer lot passes or fails. In one embodiment, the statistical information includes a mean of the measured overlay errors, as well as a standard deviation, from a plurality of targets and product wafers. The statistical information may also include a maximum overlay error value. The maximum overlay error may be determined directly from the overlay error data (by selecting the maximum measured overlay error data point) or determined by extrapolating from the overlay error data (e.g., by a polynomial curve fit to the measured overlay error data). The confidence levels may be determined in any suitable manner, for example, as described above.

It then may be determined whether a decision may be made regarding a current lot's fail or pass status in operation 908. This determination is accomplished by analyzing the confidence levels. For instance, if the overlay error data indicates that the lot passes but the confidence levels fall below a predetermined specification (e.g., 60%), steps may be taken to increase the confidence levels of the current overlay error data. In the illustrated embodiment, when it is determined that a decision cannot be made as to the status of the current wafer lot (e.g., the confidence level is too low), in operation 912 more wafers are added to the lot on which overlay measurement are then performed (later in operations 902).

When it is determined that a decision can be made as to the current wafer lot's pass/fail status, it is then determined whether the current lot passes, based on its overlay values, in operation 914. For instance, it is determined whether the current overlay errors for the current lot are within three standard deviations of the overlay error mean determined from previous lot overlay data. In an alternative implementation, it is determined whether the current lot's overlay error maximum exceeds the determined overlay error maximum. If the current overlay error exceeds the maximum or is greater than three standard deviations from the overlay mean, it is determined that the current lot fails. Otherwise, it is determined that the current lot passes. If the current lot does not pass, it is reported as failing in operation 918. Otherwise, the current lot is reported as passing in operation 916.

Improving Stepper Correction

In conventional calculations of stepper corrections, all overlay values are treated equally. By taking advantage of the confidence levels given by the provided target diagnostics, the confidence levels may be converted into weights, for weighing the influence of each overlay value in the stepper correction calculation process. In this way, overlay values whose quality is lower, have less of an influence on the final stepper corrections, and in this way the confidence that the user can have on the calculated stepper corrections will increase.

Figure 10:
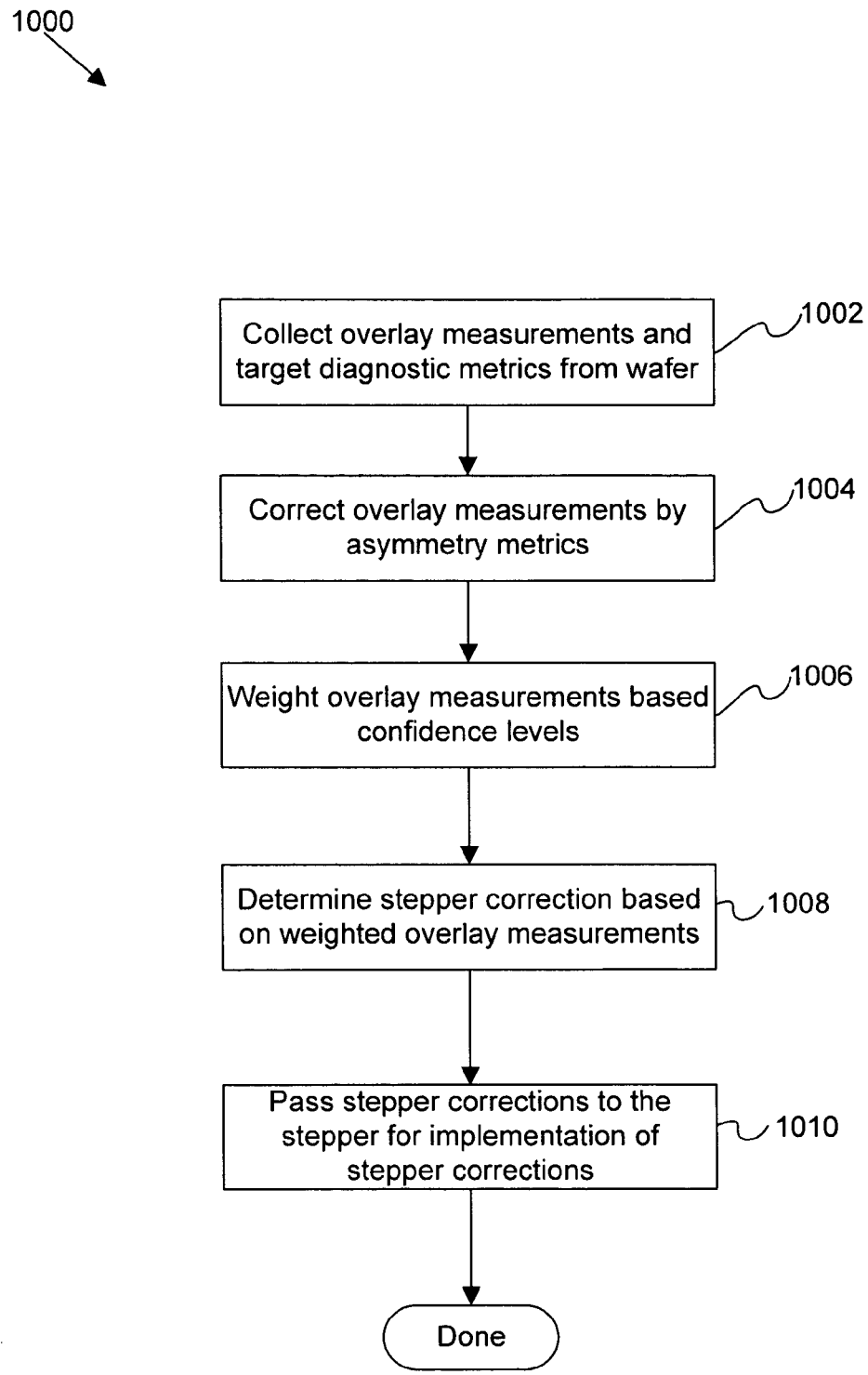
FIG. 10 is a flowchart illustrating a procedure for improving stepper correction in accordance with one embodiment of the present invention.

FIG. 10 is a flowchart illustrating a procedure 1000 for improving stepper correction in accordance with one embodiment of the present invention. Initially, overlay measurements and target diagnostic metrics are collected or provided from a wafer in operation 1002. When possible, the overlay measurements may then be corrected by the asymmetry metrics in operation 1004. This is done in the cases, where it can be demonstrated that a correction based on the asymmetry metrics gives a truer overlay value, such as in correcting for DF/FI bias. Example techniques for correcting the DF/FI bias are further described below with respect to FIGS. 12A and 12B.

The overlay measurements are also weighted based on the confidence level or similar metrics in operation 1006. In one implementation, each overlay measurement is weighted based on a determined confidence level (e.g., as determined using any of the techniques described above). For instance, confidence levels between 50 and 60% are given a weight value of 0.2; confidence levels between 61 and 70% are given a weight of 0.4; etc. In general, the weights W can be calculated from the confidence level CL as $W=f(CL; a_1, a_2, \ldots, a_N)$, where $a_1, a_2, \ldots, a_N$ are N parameters associated with function f. Function f can be either a continuous or discrete function. A stepper correction may then be determined based on the weighted overlay measurements in operation 1008. The stepper corrections are then used for process control including being passed on to the stepper, e.g., via a host computer or cell controller, where the stepper corrections may be implemented, in operation 1110. The procedure then ends.

Figure 11:
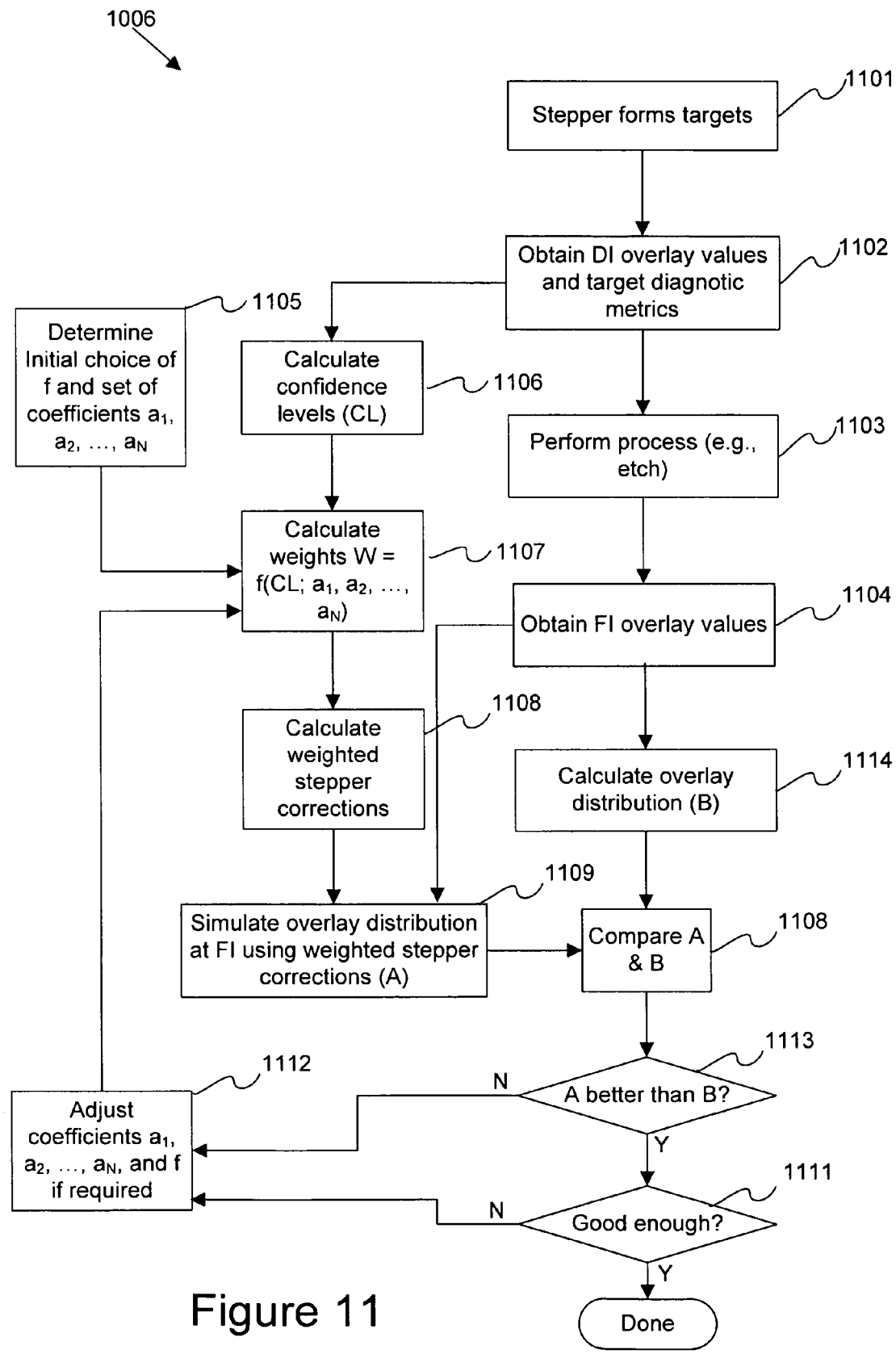
FIG. 11 is a flowchart illustrating the operation of FIG. 10 of weighting the overlay measurements based on the diagnostic metrics in accordance with one embodiment of the present invention.

FIG. 11 is a flowchart illustrating a calibration procedure for obtaining an estimate for the weights used in the operation 1006 of FIG. 10. Initially, one or more targets are formed, e.g., on one or more wafers, in a stepper operation 1101. The DI overlay values and target diagnostic metrics are then obtained from the target(s) in operation 1102. Confidence levels of the DI overlay values are then calculated, e.g., as described above, in operation 1106.

Meanwhile, an initial function f and a set of coefficients $a_1$~$a_n$ are determined in operation 1105. Weights are then calculated based on this initial function f, coefficients, and calculated confidence levels in operation 1107. The weights are then used to calculate weighted stepper corrections in operation 1108.

After the DI overlay values and target diagnostic metrics are obtained in operation 1102, a process (such as an etch process) may be performed in operation 1103. This process may be performed in parallel to determining the weighted stepper correction. FI overlay values are then obtained from the targets post process in operation 1104. The FI overlay values and the weighted stepper corrections are then used to simulate overlay distribution at FI (A) in operation 1109. In one implementation, the overlay data at FI and the difference between the actual stepper settings in the lithography (from operation 1101) and the settings indicated by the weighted stepper corrections (from operation 1108) are used to simulate the change in overlay data at FI had the weighted stepper corrections been implemented at the lithography stage.

An overlay distribution (B) is also calculated based on the obtained FI overlay values in operation 1114. A and B are compared in operation 1108, and it is then determined whether A is better than B in operation 1113. In other words, it is determined whether the determined stepper correction will likely result in an improved overlay distribution, as compared with the current stepper settings and resulting distribution. The distribution may be evaluated using any suitable criteria. By way of examples, the evaluation may be based on Total Modeled Error TME, maximum overlay, or maximum +3σ overlay. If A is better than B, it is then determined whether the stepper correction is good enough in operation 1111. In one example, the distributions of the simulated FI overlay is compared to the true FI overlay and to a criterion of "good" distribution. If the stepper correction needs to be improved or A is not better than B, the coefficients $a_1, a_2, \ldots, a_N$ and/or the function is adjusted (if needed) to improve the distribution in operation 1112.

Although an iterative method has been described with respect to FIG. 11 for improving the calculation of weight, any standard method for optimizing model weights, such as linear least squares method may be used. The calibration method can be used both for an initial calibration for a new process, as well as periodic re-calibrations.

Minimizing DF/FI Bias

The DI/FI Bias refers to the difference of overlay as measured on the same wafer and same target location in two instances of time during the process: The first time is the so-called DI (Develop Inspect or After Develop or Photo) overlay, the second is the so-called FI (Final Inspection or After Etch or Etch) overlay. This difference is due to a distortion of the overlay mark, with the major contributions coming from process effects before and up to the lithography step. Since many of these process effects on the overlay targets manifest themselves as asymmetry, they can be characterized using the target diagnostics asymmetry metrics. These metrics can be correlated to the DI/FI Bias, and in this way used for predicting the DI/FI Bias and correcting for it. Thus, one may adjust the DI overlay metrology data by the predicted DI/FI bias, and in this way obtain overlay results, which more faithfully indicate the true FI overlay. Finding the true overlay at the DI stage is preferable, since then the wafer may be easily reworked, e.g., by stripping and reapplying the photoresist.

Figure 12A:
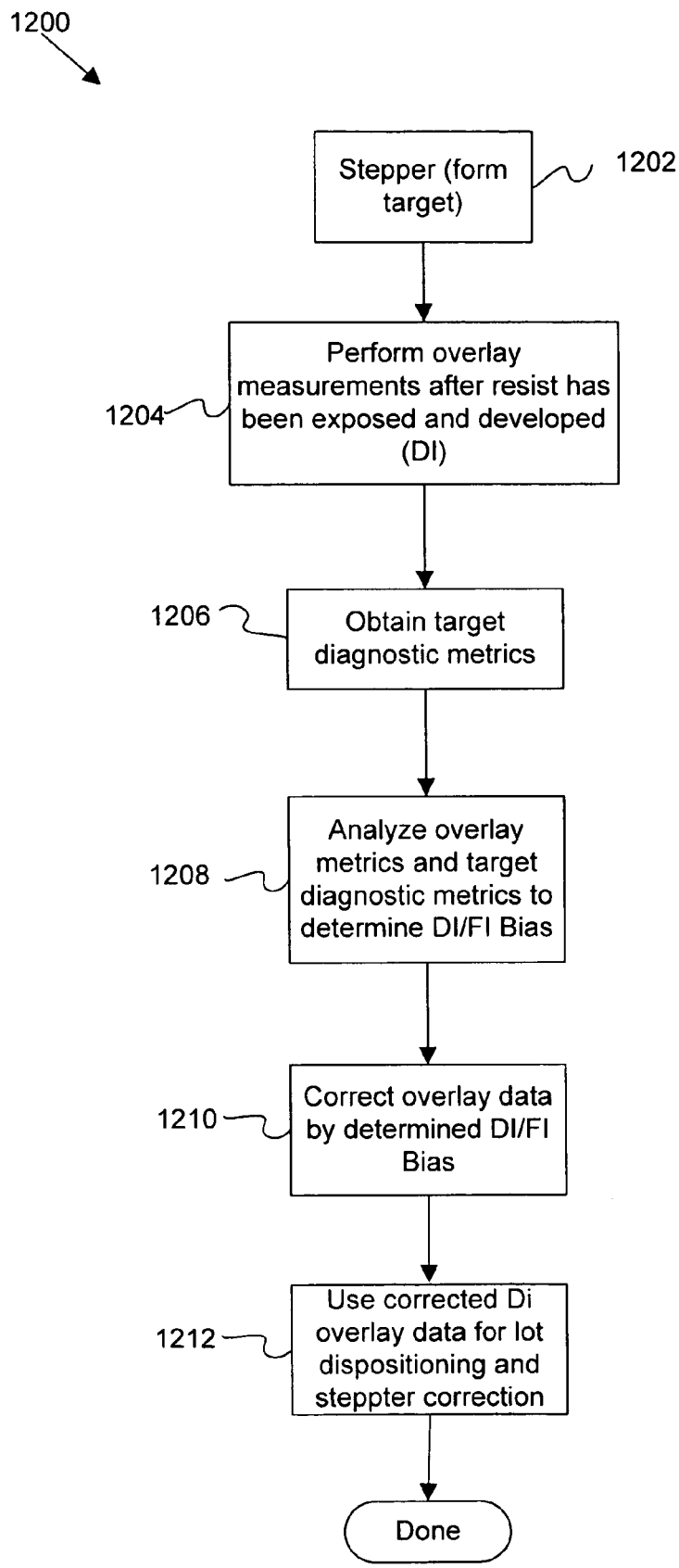
FIG. 12A is a flowchart illustrating a procedure for minimizing DF/FI bias in accordance with one embodiment of the present invention.

FIG. 12A is a flowchart illustrating a procedure for correcting for DF/FI bias in accordance with one embodiment of the present invention. Initially, one or more targets are formed by a stepper in operation 1202. Overlay measurements are then obtained after the resist has been exposed and developed (DI) in operation 1204. Target diagnostics are also obtained in operation 1206. In one implementation, x and y asymmetry values are obtained. A DI/FI bias is determined based on the target diagnostics and overlay metrics in operation 1208. For example, a formula calculating a corrected overlay measurement may be in the form of:

$$x_{corr} = x + w_x \alpha_x$$

$$y_{corr} = y + w_y \alpha_y$$

wherein x and y are the DI overlay measurements and $a_x$ and $a_y$ are the measured x and y asymmetries, respectively. The weights $w_x$ and $w_y$ may be selected initially with default values, such as 1, or determined experimentally through a calibration procedure detailed below.

After the DF/FI bias is determined, the overlay values from the DF stage may then be corrected by such determined DF/FI bias in operation 1210. The corrected overlay values may then be used for any suitable overlay analysis procedures, such as lot deposition and stepper corrections as described herein.

Figure 12B:
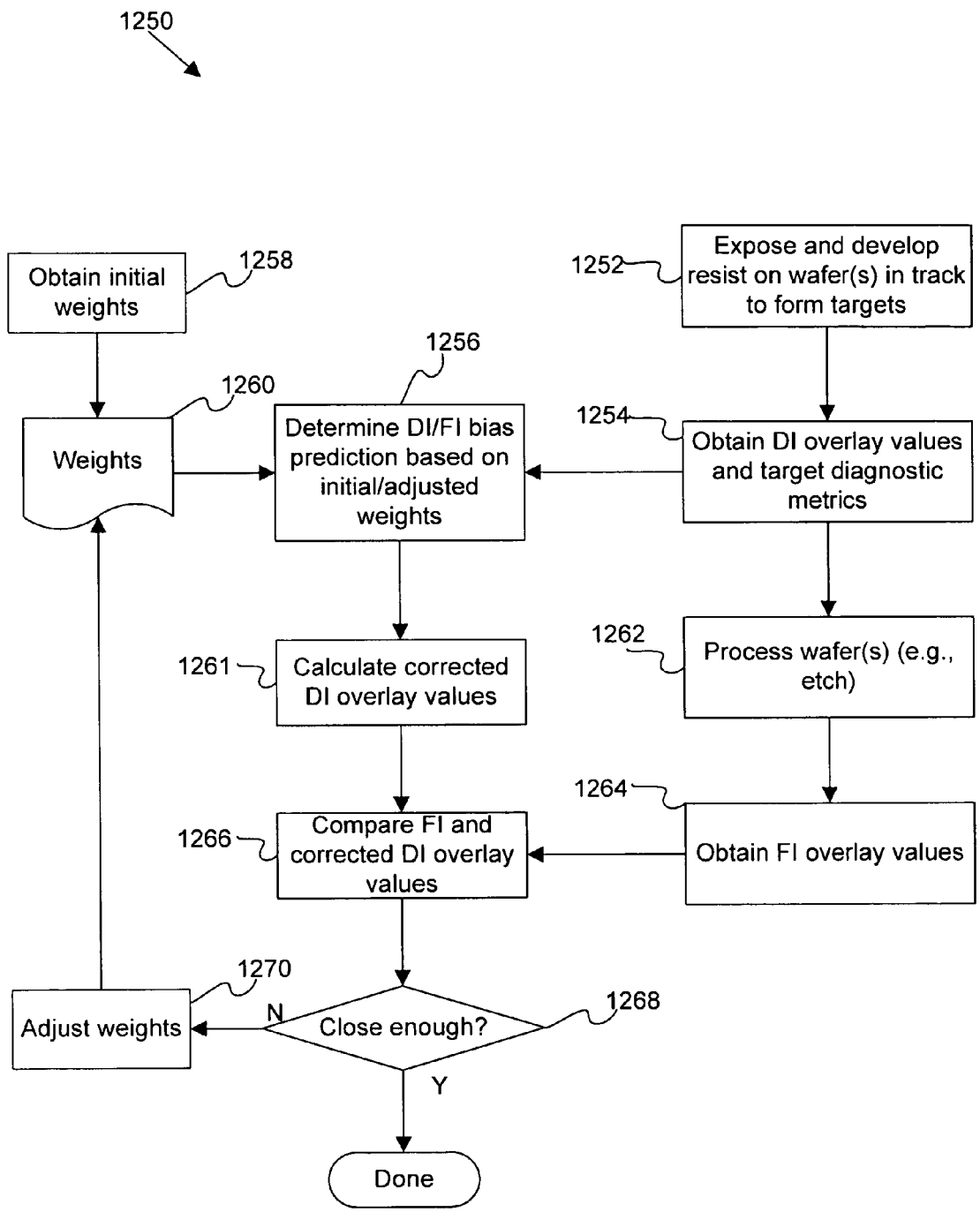
FIG. 12B is a flowchart illustrating a procedure for experimentally determining the weight values of FIG. 12A in accordance with one embodiment of the present invention.

FIG. 12B is a flowchart illustrating an example procedure for experimentally determining the weights $w_x$ and $w_y$ of FIG. 12A. Initially, one or more wafers are exposed and developed in track to form overlay targets in operation 1252. After development, DI overlay values and target diagnostic metrics are then collected from the wafers in operation 1254. The DI/FI bias prediction is determined for each measurement location based on initial values for the weights (1260) in operation 1256. The initial weight values are determined in operation 1258. The corrected DI overlay values are calculated by correcting the initial DI overlay by the DI/FI bias predictions in operation 1261

Meanwhile, the wafers have proceeded through the process step, e.g., an etching process, in operation 1262, and overlay values are then collected at the FI stage in operation 1264. The FI and corrected DI overlay values are compared in operation 1266 and it is determined whether the two values are close enough in operation 1268. For example, it is determined whether the difference between the two values is less than a predetermined difference value. Said in another way, it is determined whether the predicted DF/FI bias value matches the real DF/FI bias value. If it is determined that the two sets of overlay values are sufficiently close, the DI/FI bias prediction model weights are accepted and used in further overlay measurements and the weight calibration procedure 1250 ends. If it is determined that the two sets of overlay values are not sufficiently close, the weights (1260) are adjusted in operation 1270 and a new set of calculations (operations 1256 and 1261) and comparison (operation 1266) are performed based on the adjusted weight values (1260).

The flowchart of FIG. 12B shows an iterative procedure for determining the weights, although any other commonly known method for determining the best solution for model coefficients may be used (e.g., linear least squares method). The calibration procedure may also be used both for determining the weights at the start of a new process, as well as for periodic re-calibrations of the weights.

Process Excursion Monitoring

Since the provided target diagnostics quantify the effects of certain processes on the overlay targets, the metrics of target diagnostics may be used to monitor process changes. Reference levels may be set up, and excursions from these reference levels beyond a pre-set distance will trigger a warning or automated fault detection signal to the operator and/or host/APC (advanced process control) system. The values and locations of values beyond pre-set levels can be presented on a wafer map. Trends of the metrics may then be used by the APC system.

Figure 13A:
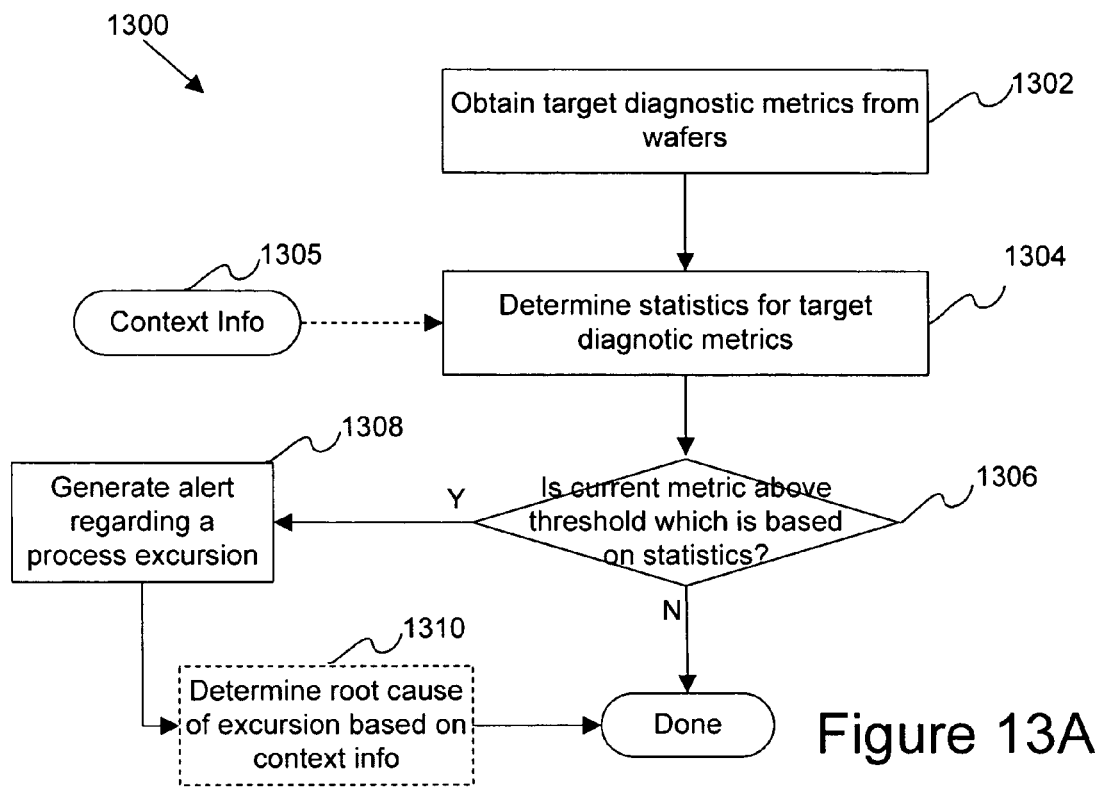
FIG. 13A is a flowchart illustrating a procedure for determining a process excursion and its root cause in accordance with a first embodiment of the present invention.

FIG. 13A is a flowchart illustrating a procedure 1300 for determining a process excursion in accordance with a first embodiment of the present invention. Initially, target diagnostic metrics, including asymmetry and noise metrics, are obtained from a number of targets in operation 1302. These targets may originate from different wafers. Statistics based on one or more of the target diagnostics metrics are then determined in operation 1304. For example, a systematic and/or noise metric mean and standard deviation may be determined for the targets fabricated so far. In another example, an average confidence level and standard deviation may be determined.

It is then determined whether any of the metrics for a current wafer is above a predefined threshold based on the determined statistics in operation 306. For example, it is determined whether a particular lot's noise metric is more than 3σ a above the average noise metric. Alternatively, it is determined whether the current systematic error metric is significantly higher than (e.g., greater than 3σ) the average systematic error. In other examples, it is determined whether a current confidence levels are within statistical range of an average confidence level. In an alternative implementation, it is simply determined whether a metric or confidence level is above a predefined threshold without determining statistical information from a set of wafers. The threshold may be determined experimentally or theoretically. If the metrics for the current targets are above the predetermined threshold, an alert may be generated regarding a process excursion in operation 1308. The excursion may have occurred for a single process for a single wafer or for a set of processes for an entire wafer or wafer lot. The process then ends or alternatively an automated recovery process is initiated.

Figure 13B:
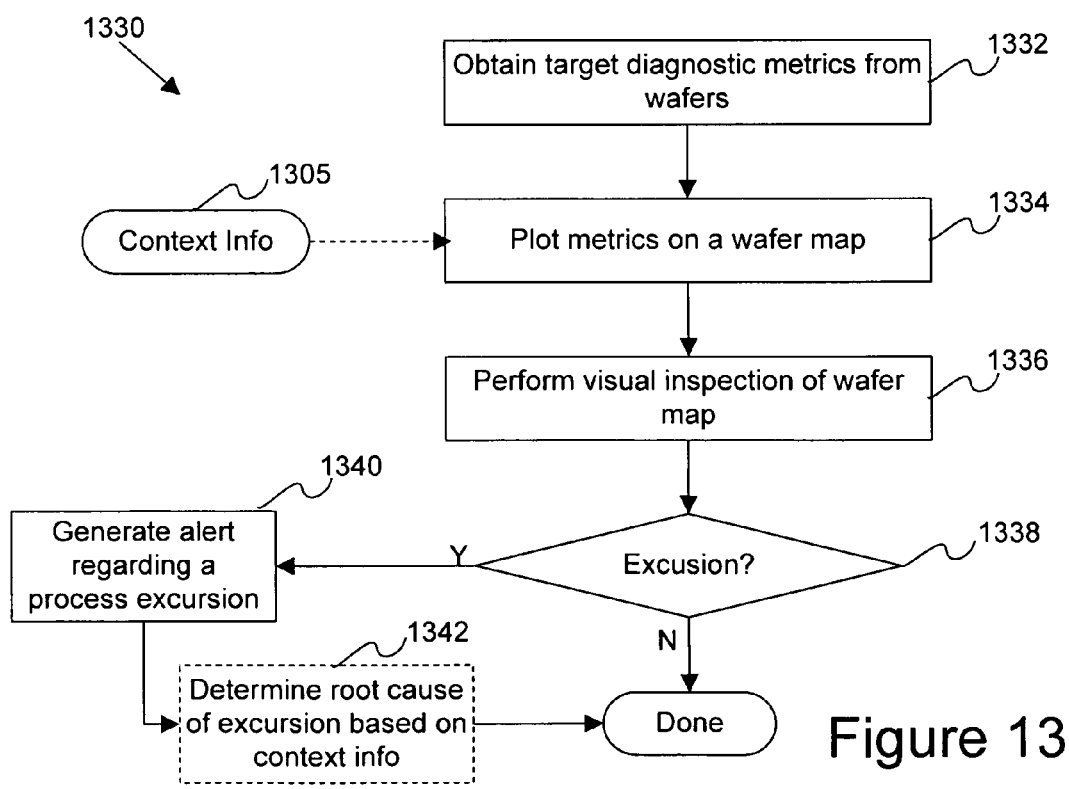
FIG. 13B is a flowchart illustrating a procedure for determining a process excursion and its root cause in accordance with a second embodiment of the present invention.

FIG. 13B is a flowchart illustrating a procedure 1330 for determining a process excursion in accordance with a second embodiment of the present invention. Initially, target diagnostic metrics are determined from a wafer in operation 1332. The metrics are then plotted on a wafer map in operation 1334. A visual inspection of the wafer map is then performed in operation 1336. It is then manually determined whether an excursion has occurred in operation 1338. For instance, noise or systematic metric excursions for a particular wafer portion may be identified visually on such wafer map. In another example, wafer maps from a number of lots may be displayed side by side to identify a wafer having a deviant metric. Additionally, confidence levels may be plotted in a wafer map and deviations may be correlated to a process excursion. In general, any qualitative or quantitative change of the target diagnostic metric distribution on the wafer map If an excursion has occurred, an alert regarding the process excursion is generated in operation 1340 and the procedure then ends. Procedures for correcting the process excursion may then be implemented.

Root Cause Analysis

The idea of process monitoring from the previous section may be taken one step further in a root cause analysis By combining the target diagnostic metrics with lot history, correlations may be found between process excursions and certain contexts such as process tools, process layers, devices, etc. This will identify, for example, process tools which are working outside their optimal operating points. In the embodiments of FIGS. 13A and 13B, context information (1305) is correlated with each target and its target diagnostic metrics. The context information may include any suitable information useful in determining root cause, such as process identity, lot identity, wafer identity, process tool operation settings, etc. When an excursion occurs, the root cause of such excursion may then be determined based on the correlated context information (e.g., in operation 1310 and 1342). That is, it is determined which context information is associated with the excursion, and such context information is identified as the root cause. In one example, a particular process tool may be associated with the excursion and identified as a root cause.

In addition to comparing statistical data about the target metrics across field, across wafer, wafer to wafer, lot to lot, layer to layer, device to device, process to process, etc, it is also beneficial to garner further information directly from the metrology signal itself (image, scan, etc.). In one embodiment, the target metrics are used to identify the subset of measurements which do not meet a pre-defined specification (e.g. measurements of poor or suspect quality). For these measurements, the metrology signal (image, scan, etc.) is stored and presented for further analysis: manual inspection, further signal processing, etc. From this information, further root cause analysis can occur.

Figure 14:
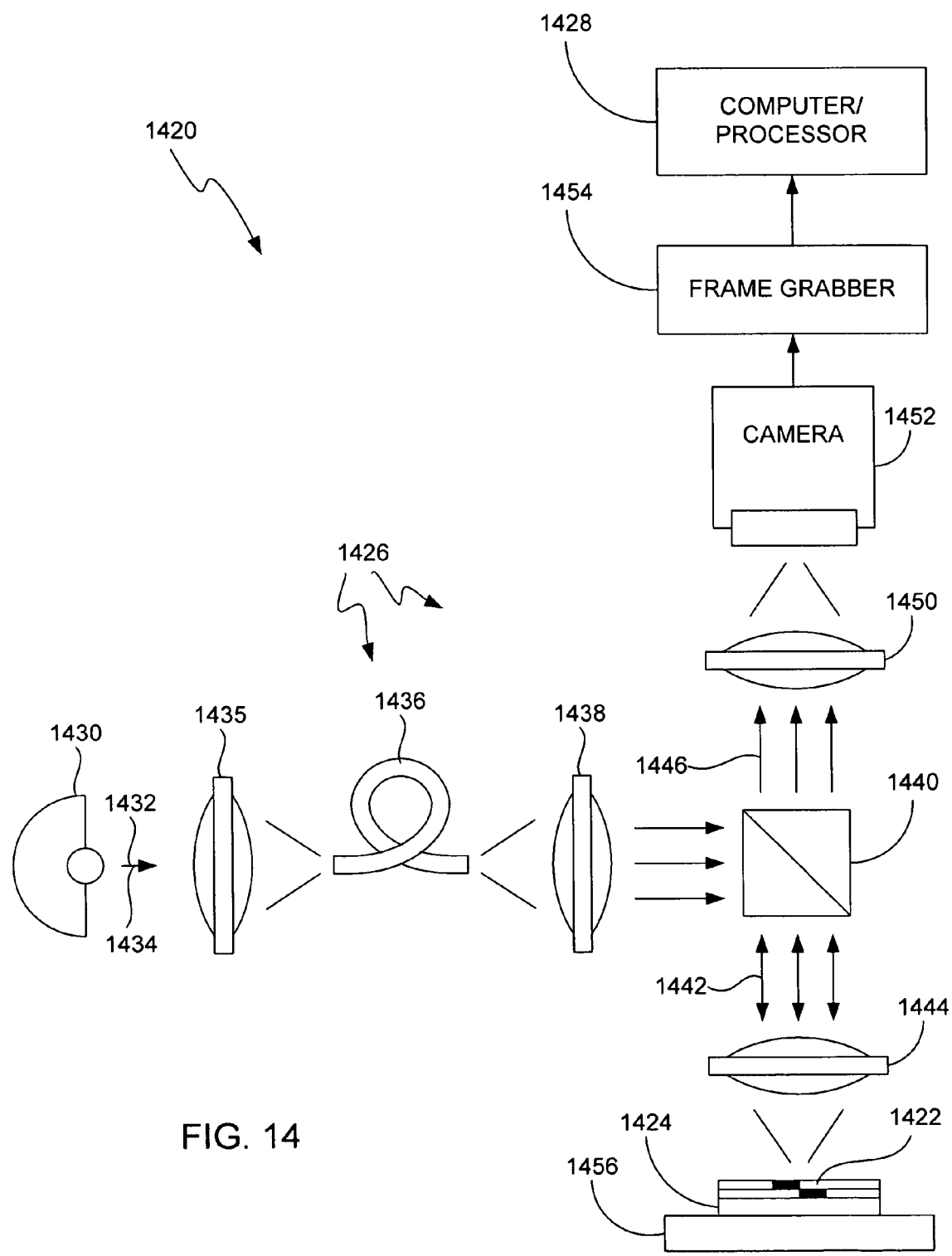
FIG. 14 is a simplified diagram of an overlay measurement system, in accordance with one embodiment of the present invention.

Metrology System:

FIG. 14 is a simplified diagram of an overlay measurement system or metrology tool 1420 that may be used to measure overlay in any of the marks described above via imaging. Imaging is a very developed technology with large user acceptance, and components that are readily available to the user. As is generally well known, imaging is an effective way to collect a large amount of information at any one time. That is, all points within the mark may be observed simultaneously. Furthermore, imaging allows a user to see what is actually being measured on the wafer. The dimensions of various components are exaggerated to better illustrate this embodiment.

The overlay measurement system 1420 is arranged to determine overlay error, systematic metrics, and noise metrics via one or more overlay targets 1422 disposed on a wafer 1424. In most cases, the overlay targets 1422 are positioned within the scribe lines of the wafer 1424. As is generally well known, scribe lines are the areas of the wafer used for sawing and dicing the wafer into a plurality of dies. It should be noted, however, that this is not a limitation and that the position of the targets may vary according to the specific needs of each device design. For example, the designer of the semiconductor device may choose to insert overlay targets inside the area of the active devices. As shown, the overlay measurement system 1420 includes an optical assembly 1426 and a computer system 1428 having a processor and one or more memory devices. The optical assembly 1426 is generally arranged to capture the images of the overlay target 1422. The computer, on the other hand, is generally arranged to calculate the relative displacement and target diagnostics of the elements of the overlay target from the captured images.

In the illustrated embodiment, the optical assembly 1426 includes a light source 1430 (e.g., incoherent or coherent, although incoherent is generally preferred) arranged to emit light 1432 along a first path 1434. The light 1432 is made incident on a first lens 1435, which focuses the light 1432 onto a fiber optic line 1436 configured to pass the light 1432 there through. When the light 1432 emerges from fiber optic line 1436, it then passes through a second lens 1438, which is arranged to image the end of the optical fiber 1436 to a suitable optical plane in the optical system, such as the entrance pupil of the objective lens 1444. The light 1432 then continues on its path until it reaches a beam splitter cube 1440, which is arranged to direct the light onto a path 1442. The light 1432 continuing along path 1442 is made incident on an objective lens 1444, which relays the light 1432 onto the wafer 1424.

The light 1432, which reflects off of the wafer 1424, is then collected by the objective lens 1444. As should be appreciated, the reflected light 1432 that is collected by the objective lens 1444 generally contains an image of a portion of the wafer 1424, as for example, the image of the overlay target 1422. When the light 1432 leaves the objective 1444, it continues along path 1442 (upward in FIG. 14) until it reaches the beam splitter cube 1440. In general, the objective lens 1444 manipulates the collected light in a manner that is optically reverse in relation to how the incident light was manipulated. That is, the objective lens 1444 re-images the light 1432 and directs the light 1432 towards the beam splitter cube 1440. The beam splitter cube 1440 is arranged to direct the light 1432 onto a path 1446. The light 1432 continuing on path 1446 is then collected by a tube lens 1450, which focuses the light 1432 onto a camera 1452 that records the image of the wafer 1424, and more particularly the image of the target 1422. By way of example, the camera 1452 may be a charge couple device (CCD), a two-dimensional CCD, or linear CCD array. In most cases, the camera 1452 transforms the recorded image into electrical signals, which are sent to the computer 1428. After receiving the electrical signals, the computer 1428 performs analysis using algorithms that calculate the overlay error and target diagnostics of the image as described above. Analysis algorithms for determining overlay error are described in greater detail below.

The system 1420 further includes a frame grabber 1454 that works with the computer 1428 and the camera 1452 to grab images from the wafer 1424. Although the frame grabber 1454 is shown as a separate component, it should be noted that the frame grabber 1454 may be part of the computer 1428 and/or part of the camera 1452. The function of the frame grabber 1454 is generally to convert the signals from camera 1452 into a form usable by the computer 1428. The overlay metrology event is divided into two functions— target acquisition and image grab. During target acquisition, the frame grabber 1454 and computer 1428 cooperate with a wafer stage 1456 to place the target in focus and to position the target as closes as possible to the center of the field of view (FOV) of the metrology tool. In most cases, the frame grabber grabs a plurality of images (e.g., not the images used to measure overlay) and the stage moves the wafer between these grabs until the target is correctly positioned in the X, Y and Z directions. As should be appreciated, the X&Y directions generally correspond to the field of view (FOV) while the Z direction generally corresponds to the focus. Once the frame grabber determines the correct position of the target, the second of these two functions is implemented (e.g., image grab). During image grab, the frame grabber 1454 makes a final grab or grabs so as to capture and store the correctly positioned target images, i.e., the images that are used to determine overlay and target diagnostics.

After grabbing the images, information is extracted from the grabbed images to determine the overlay error. Various algorithms may then be used to determine the registration error between various layers of a semiconductor wafer. For example, a frequency domain based approach, a space domain based approach, Fourier transform algorithms, zero-crossing detection, correlation and cross-correlation algorithms and others may be used.

Algorithms proposed for determining overlay and target diagnostic metrics, such as asymmetry, via the marks described herein (e.g., marks that contain periodic structures) can generally be divided into a few groups. For instance, one group may relate to phase retrieval based analysis. Phase retrieval based analysis, which is often referred to as frequency domain based approaches, typically involves creating one dimensional signals by collapsing each of the working zones by summing pixels along the lines of the periodic structure. Examples of phase retrieval algorithms that may be used are described in U.S. Pat. No. 6,023,338 issued to Bareket, U.S. patent application Ser. No. 09/603,120 filed on Jun. 22, 2000, and U.S. patent application Ser. No. 09/654,318 filed on Sep. 1, 2000, all of which are incorporated herein by reference.

Yet another phase retrieval algorithm that may be used is described in U.S. application Ser. No. 09/697,025 filed on Oct. 26, 2000, which is also incorporated herein by reference. The phase retrieval algorithm disclosed therein decomposes signals into a set of harmonics of the basic signal frequency. Quantitative comparison of different harmonics' amplitudes and phases provide important information concerning signals' symmetry and spectral content. In particular, the phase difference between the 1st and 2nd or higher harmonics of the same signal (calibrated with their amplitudes) measures the degree of the signal asymmetry. The major contributions to such asymmetry come from the optical misalignment and illumination asymmetry in the metrology tool (tool induced shifts), as well as process induced structural features (wafer induced shifts). Comparing this misregistration between the phases of the 1st and the 2nd harmonics for the signals acquired from different parts of the field of view on the same process layer may provide independent information about optical aberrations of the metrology tool. Finally, comparing these misregistrations from measurements at a given orientation with those obtained after rotating the wafer 180 degrees allows separation of the tool induced and wafer induced shifts due to asymmetry.

Yet another phase retrieval algorithm that may be used is Wavelet analysis. Wavelet analysis is somewhat similar to that described in the section above, however, now a dynamic window is moved across the one dimensional signal and the phase estimation is carried out in a more localized way. This is particularly of interest with use in the case of a chirped periodic structure.

Another group may relate to intensity correlation based methods. In this approach the centers of symmetry for each process layer is found separately by calculating the cross covariance of one signal with the reversed signal from the opposite part of the mark, from the same process layer. This technique is similar to techniques used today with regards to box in box targets.

The above techniques are brought by way of example and have been tested and demonstrated good performance. Other alternative algorithmic methods for calculation of overlay include other variations of auto & cross correlation techniques, error correlation techniques, error minimization techniques, such as minimization of absolute difference, minimization of the square of the difference, threshold based techniques including zero cross detection, and peak detection. There are also dynamic programming algorithms which can be used for searching for the optimal matching between two one-dimensional patterns. As mentioned above, the analysis algorithms and approaches may be utilized with respect to all of the various overlay marks described in the previous section.

Importantly, it should be noted that the above diagram and description thereof is not a limitation and that the overlay image system may be embodied in many other forms. For example, it is contemplated that the overlay measurement tool may be any of a number of suitable and known imaging or metrology tools arranged for resolving the critical aspects of overlay marks formed on the surface of the wafer. By way of example, overlay measurement tool may be adapted for bright field imaging microscopy, darkfield imaging microscopy, full sky imaging microscopy, phase contrast microscopy, polarization contrast microscopy, and coherence probe microscopy. It is also contemplated that single and multiple image methods may be used in order to capture images of the target. These methods include, for example, single grab, double grab, single grab coherence probe microscopy (CPM) and double grab CPM methods. These types of systems, among others, are readily available commercially. By way of example, single and multiple image methods may be readily available from KLA-Tencor of San Jose, Calif. Non-imaging optical methods, such as Scatterometry, may be contemplated, as well as non-optical methods such as SEM (Scanning Electron Microscope) and non-optical stylus-based instruments, such as AFM (Atomic Force Microscope) or profilometers.

Regardless of the system's configuration for practicing techniques of the present invention, it may employ one or more memories or memory modules configured to store data, program instructions for the general-purpose inspection operations and/or the inventive techniques described herein. The program instructions may control the operation of an operating system and/or one or more applications, for example. The memory or memories may also be configured to store images of targets, overlay error values, target diagnostic metrics, and confidence levels, as well as values for particular operating parameters of the inspection system.

Although the foregoing invention has been described in some detail for purposes of clarity of understanding, it will be apparent that certain changes and modifications may be practiced within the scope of the appended claims. Therefore, the described embodiments should be taken as illustrative and not restrictive, and the invention should not be limited to the details given herein but should be defined by the following claims and their full scope of equivalents.

What is claimed is:

1. A method for analyzing an overlay target of a semiconductor component, the method comprising:
   (a) determining an overlay error value between two layers of the overlay target; and
   (b) determining a systematic error metric for the overlay target by comparing selected target portions of the overlay target that are on a same layer and are designed to be symmetric with respect to each other whereby the determined systematic error metric quantifies any asymmetries between such selected target portions.

2. The method as recited in claim 1, further comprising:
   determining a characteristic related to the overlay error value based on the systematic error metric,
   wherein the characteristic (i) defines whether the overlay error value is a flyer, (ii) is a confidence level, (iii) is a stepper correction which can be input into a stepper tool to reduce contribution of the stepper tool to overlay error, (iv) is a bias value representing a difference between an DI (development inspection) overlay value and a FI (final inspection) overlay value, wherein the DI overlay value results from a target after a photoresist layer has been developed and prior to a process utilizing the developed photoresist layer and the FI overlay value results from the process utilizing the developed photoresist layer, or (v) defines whether a process excursion has occurred.

3. The method as recited in claim 2, wherein the characteristic defines whether the overlay error value is a flyer and wherein determining the characteristic that defines whether the overlay error value is a flyer is accomplished by:
   determining a confidence level based on the systematic error metric; and
   when the confidence level is out of predefined specification, defining the overlay error value as a flyer.

4. The method as recited in claim 3, further comprising halting further analysis of the overlay error value when it is defined as a flyer.

5. The method as recited in claim 4, further comprising repeating operations (a) through (c) for an alternative target when the alternative target exists for a current overlay target and the overlay error value for the current overlay target is defined as a flyer.

6. The method as recited in claim 2, wherein the characteristic is a confidence level.

7. The method as recited in claim 6, further comprising repeating operations (a) through (b) for a plurality of targets from a plurality of reference wafer lots.

8. The method as recited in claim 2, wherein the characteristic is a stepper correction which can be input into a stepper tool to reduce contribution of the stepper tool to overlay error.

9. The method as recited in claim 8, wherein determining the stepper correction comprises:
   obtaining a plurality of overlay error values and a plurality of systematic error metrics for a plurality of overlay targets of a current wafer;
   correcting the overlay error values by the systematic error metrics;
   weighting each overlay error value based on a confidence level of the each overlay error; and
   determining the stepper correction based on the corrected and weighted overlay error values.

10. The method as recited in claim 9, further comprising adjusting the stepper tool by the stepper correction.

11. The method as recited in claim 2, wherein the characteristic is a bias value representing a difference between an DI (development inspection) overlay value and a FI (final inspection) overlay value, wherein the DI overlay value results from a target after a photoresist layer has been developed and prior to a process utilizing such developed photoresist layer and the FI overlay value results from the process utilizing the developed photoresist layer.

12. The method as recited in claim 2, wherein the characteristic defines whether a process excursion has occurred.

13. The method as recited in claim 12, further comprising repeating operation (a) and (b) for a plurality of targets on a plurality of product wafers and wherein the determining whether a process excursion has occurred is accomplished by:
   plotting the systematic error metrics provided by the plurality of product wafers, the plots being in a form of wafer maps;
   visually inspecting the wafer maps for a significant change in any of the plots; and
   when there is a significant change in a particular plot, determining that a process excursion has occurred for a wafer associated with such plot.

14. A computer system for analyzing an overlay target of a semiconductor component, comprising:
   one or more processors;
   one or more memory, wherein at least one of the processors and memory are adapted to:
   (a) determine an overlay error value between two layers of the overlay target; and
   (b) determine a systematic error metric for the overlay target by comparing selected target portions of the overlay target that are on a same layer and are designed to be symmetric with respect to each other whereby the determined systematic error metric quantifies any asymmetries between such selected target portions.

15. The computer system as recited in claim 14, wherein the at least one of the processors and memory are further adapted to determine a characteristic related to the overlay error value based on the systematic error metric, wherein the characteristic (i) defines whether the overlay error value is a flyer, (ii) is a confidence level, (iii) is a stepper correction which can be input into a stepper tool to reduce contribution of the stepper tool to overlay error, (iv) is a bias value representing a difference between an DI (development inspection) overlay value and a FI (final inspection) overlay value, wherein the DI overlay value results from a target after a photoresist layer has been developed and prior to a process utilizing the developed photoresist layer and the FI overlay value results from the process utilizing the developed photoresist layer, or (v) defines whether a process excursion has occurred.

16. The computer system as recited in claim 15, wherein the characteristic defines whether the overlay error value is a flyer and wherein determining the characteristic that defines whether the overlay error value is a flyer comprises:
   determining a confidence level based on the systematic error metric; and
   when the confidence level is out of predefined specification, defining the overlay error value is a flyer.

17. The computer system as recited in claim 16, further comprising halting further analysis of the overlay error value when it is defined as a flyer.

18. The computer system as recited in claim 17, further comprising repeating operations (a) through (b) for an alternative target when the alternative target exists for a current overlay target and the overlay error value for the current overlay target is defined as a flyer.

19. The computer system as recited in claim 15, wherein the characteristic is a confidence level.

20. The computer system as recited in claim 19, further comprising repeating operations (a) through (b) for a plurality of targets from a plurality of semiconductor wafers.

21. The computer system as recited in claim 15, wherein the characteristic is a stepper correction which can be input into a stepper tool to reduce contribution of the stepper tool to overlay error.

22. The computer system as recited in claim 15, wherein the characteristic is a bias value representing a difference between an DI (development inspection) overlay distribution and a FI (final inspection) overlay distribution, wherein the DI overlay distribution results from a target after a photoresist layer has been developed and prior to a process utilizing the developed photoresist layer and the FI overlay distribution results from the process utilizing the developed photoresist layer.

23. The computer system as recited in claim 15, wherein the characteristic defines whether a process excursion has occurred.

24. The computer system as recited in claim 23, further comprising repeating operation (a) for a plurality of targets on a plurality of product wafers and wherein the determining whether a process excursion has occurred is accomplished by:
monitoring changes related to the systematic error metrics provided by the plurality of product wafers; and
when a significant change occurs, determining that a process excursion has occurred for a wafer associated with such significant change.

25. The computer system as recited in claim 24, further comprising determining a confidence level for each overlay error value, wherein the changes that are monitored include changes to the confidence level.

26. A method for analyzing an overlay target of a semiconductor component, the method comprising:
(a) determining an overlay error value between two layers of the overlay target; and
(b) determining a noise metric that quantifies spatial noise that is proximate to the overlay target.

27. The method as recited in claim 26, further comprising:
determining a characteristic related to the overlay error value based on the noise metric,
wherein the characteristic (i) defines whether the overlay error value is a flyer, (ii) is a confidence level, (iii) is a stepper correction which can be input into a stepper tool to reduce contribution of the stepper tool to overlay error, (iv) is a bias value representing a difference between an DI (development inspection) overlay value and a FI (final inspection) overlay value, wherein the DI overlay value results from a target after a photoresist layer has been developed and prior to a process utilizing the developed photoresist layer and the FI overlay value results from the process utilizing the developed photoresist layer, or (v) defines whether a process excursion has occurred.

28. The method as recited in claim 27, wherein the characteristic is a stepper correction which can be input into a stepper tool to reduce the stepper tool's contribution to overlay error.

29. The method as recited in claim 27, wherein the characteristic defines whether the overlay error value is a flyer.

30. The method as recited in claim 27, wherein the characteristic is a confidence level.

31. The method as recited in claim 27, wherein the characteristic is a stepper correction which can be input into a stepper tool to reduce contribution of the stepper tool to overlay error.

32. The method as recited in claim 27, wherein the characteristic is a bias value representing a difference between an DI (development inspection) overlay value and a FI (final inspection) overlay value, wherein the DI overlay value results from a target after a photoresist layer has been developed and prior to a process utilizing such developed photoresist layer and the FI overlay value results from the process utilizing the developed photoresist layer.

33. The method as recited in claim 27, wherein the characteristic defines whether a process excursion has occurred.

* * * * *